(12) United States Patent
Nakazawa

(10) Patent No.: US 11,727,995 B2
(45) Date of Patent: Aug. 15, 2023

(54) SEMICONDUCTOR MEMORY DEVICE PERFORMING A READ OPERATION

(71) Applicant: Kioxia Corporation, Tokyo (JP)

(72) Inventor: Shingo Nakazawa, Kamakura (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/467,815

(22) Filed: Sep. 7, 2021

(65) Prior Publication Data

US 2022/0310175 A1 Sep. 29, 2022

(30) Foreign Application Priority Data

Mar. 23, 2021 (JP) .................................. 2021-049289

(51) Int. Cl.
| | |
|---|---|
| G11C 7/22 | (2006.01) |
| G11C 16/26 | (2006.01) |
| G11C 16/04 | (2006.01) |
| G11C 16/30 | (2006.01) |
| H01L 23/48 | (2006.01) |
| H10B 43/10 | (2023.01) |
| H10B 43/27 | (2023.01) |

(52) U.S. Cl.
CPC .......... *G11C 16/26* (2013.01); *G11C 16/0483* (2013.01); *G11C 16/30* (2013.01); *H01L 23/481* (2013.01); *H10B 43/10* (2023.02); *H10B 43/27* (2023.02)

(58) Field of Classification Search
CPC ..... G11C 16/26; G11C 16/0483; G11C 16/30; G11C 11/5671; G11C 16/08; G11C 16/3418; G11C 16/3445; G11C 16/3459; H01L 23/481; H01L 27/11565; H01L 27/11582
USPC ................................................. 365/189.011
See application file for complete search history.

(56) References Cited

U.S. PATENT DOCUMENTS

| | | | |
|---|---|---|---|
| 9,455,266 B2 | 9/2016 | Pekny | |
| 9,520,485 B2 | 12/2016 | Lue | |
| 10,236,254 B1 | 3/2019 | Arai et al. | |
| 2018/0323208 A1 | 11/2018 | Sugino et al. | |
| 2020/0091169 A1* | 3/2020 | Tokutomi | H01L 27/11556 |

(Continued)

FOREIGN PATENT DOCUMENTS

JP 2019-54182 A 4/2019

*Primary Examiner* — Tha-O H Bui
(74) *Attorney, Agent, or Firm* — Oblon, McClelland, Maier & Neustadt, L.L.P.

(57) ABSTRACT

A semiconductor memory device includes: first conductive layers; second conductive layers; a first semiconductor layer disposed between the first conductive layers and the second conductive layers; a charge storage layer that includes a first part disposed between the plurality of first conductive layers and the first semiconductor layer and a second part disposed between the plurality of second conductive layers and the first semiconductor layer; and a first wiring electrically connected to the first semiconductor layer. The semiconductor memory device is configured such that a read operation and a first operation performed before the read operation are performable. In the first operation: a first voltage is supplied to the first wiring; and a second voltage smaller than the first voltage is supplied to an n-th second conductive layer counted from the one side in the first direction.

17 Claims, 28 Drawing Sheets

(56) References Cited

U.S. PATENT DOCUMENTS

2020/0143895 A1\* 5/2020 Futatsuyama .......... H10B 41/27
2020/0273500 A1\* 8/2020 Takada .............. H01L 27/11582

\* cited by examiner

SEMICONDUCTOR MEMORY DEVICE PERFORMING A READ OPERATION

CROSS-REFERENCE TO RELATED APPLICATIONS

This application is based upon and claims the benefit of Japanese Patent Application No. 2021-049289, filed on Mar. 23, 2021, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of first conductive layers arranged in a first direction intersecting with a surface of the substrate, a plurality of second conductive layers disposed separately from the plurality of first conductive layers in a second direction intersecting with the first direction and arranged in the first direction, a first semiconductor layer disposed between the plurality of first conductive layers and the plurality of second conductive layers, extending in the first direction, and opposed to the plurality of first conductive layers and the plurality of second conductive layers, a charge storage layer including a first part disposed between the plurality of first conductive layers and the first semiconductor layer and a second part disposed between the plurality of second conductive layers and the first semiconductor layer.

DETAILED DESCRIPTION

Figure 1:
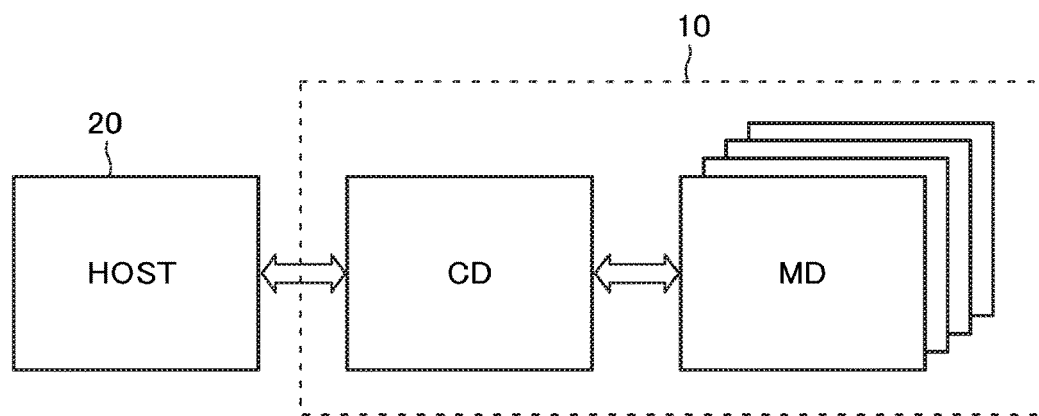
FIG. 1 is a schematic block diagram illustrating a configuration of a memory system 10 according to a first embodiment.

A semiconductor memory device according to one embodiment comprises: a plurality of first conductive layers; a plurality of second conductive layers; a first semiconductor layer disposed between the plurality of first conductive layers and the plurality of second conductive layers; a charge storage layer that includes a first part disposed between the plurality of first conductive layers and the first semiconductor layer and a second part disposed between the plurality of second conductive layers and the first semiconductor layer; and a first wiring electrically connected to the first semiconductor layer. The plurality of first conductive layers are arranged in a first direction. The plurality of second conductive layers are spaced from the plurality of first conductive layers in a second direction intersecting with the first direction and arranged in the first direction. The first semiconductor layer extends in the first direction and is opposed to the plurality of first conductive layers and the plurality of second conductive layers. The semiconductor memory device is configured to be able to perform a read operation and a first operation performed before the read operation. In the read operation: a read voltage is supplied to an n-th (n is an integer of one or more) first conductive layer among the plurality of first conductive layers counted from one side in the first direction; and a read pass voltage larger than the read voltage is supplied to at least apart of the plurality of first conductive layers. In the first operation: a first voltage is supplied to the first wiring; and a second voltage smaller than the first voltage is supplied to an n-th second conductive layer among the plurality of second conductive layers counted from the one side in the first direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the second configuration is connected to the third configuration via the first configuration.

In this specification, when referring to that a circuit or the like "electrically conducts" two wirings or the like, it may mean, for example, that this circuit or the like includes a transistor or the like, this transistor or the like is disposed on a current path between two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

FIG. 1 is a schematic block diagram illustrating a configuration of a memory system 10 according to the first embodiment.

The memory system 10, for example, reads, writes, and erases user data in response to a signal transmitted from a host computer 20. The memory system 10 is, for example, any system that can store the user data including a memory chip, a memory card, and an SSD. The memory system 10 includes a plurality of memory dies MD and a controller die CD. The memory die MD stores the user data. The controller die CD is connected to the plurality of memory dies MD and the host computer 20. The controller die CD includes, for example, a processor and a RAM. The controller die CD performs conversion between a logical address and a physical address, bit error detection/correction, a garbage collection (compaction), a wear leveling, and the like.

Figure 2:
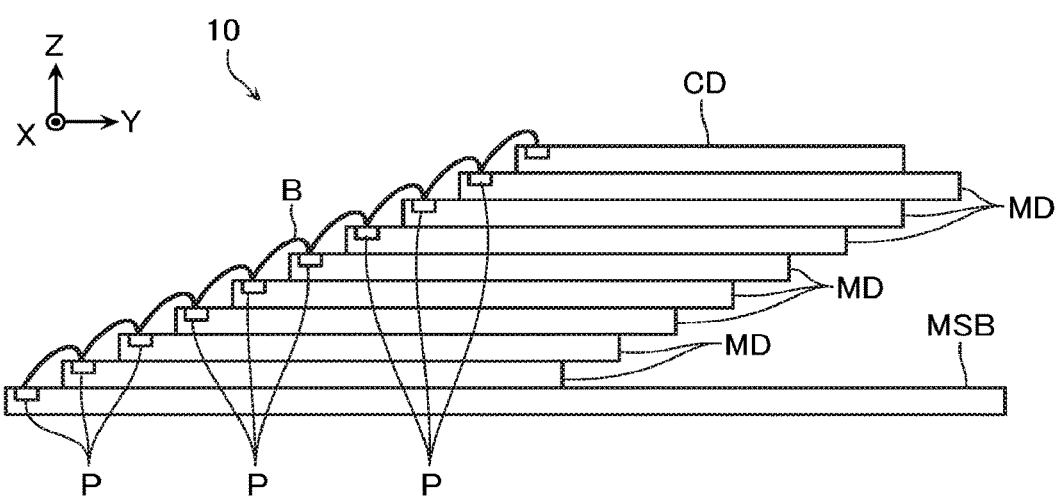
FIG. 2 is a schematic side view illustrating an exemplary configuration of the memory system 10.
Figure 3:
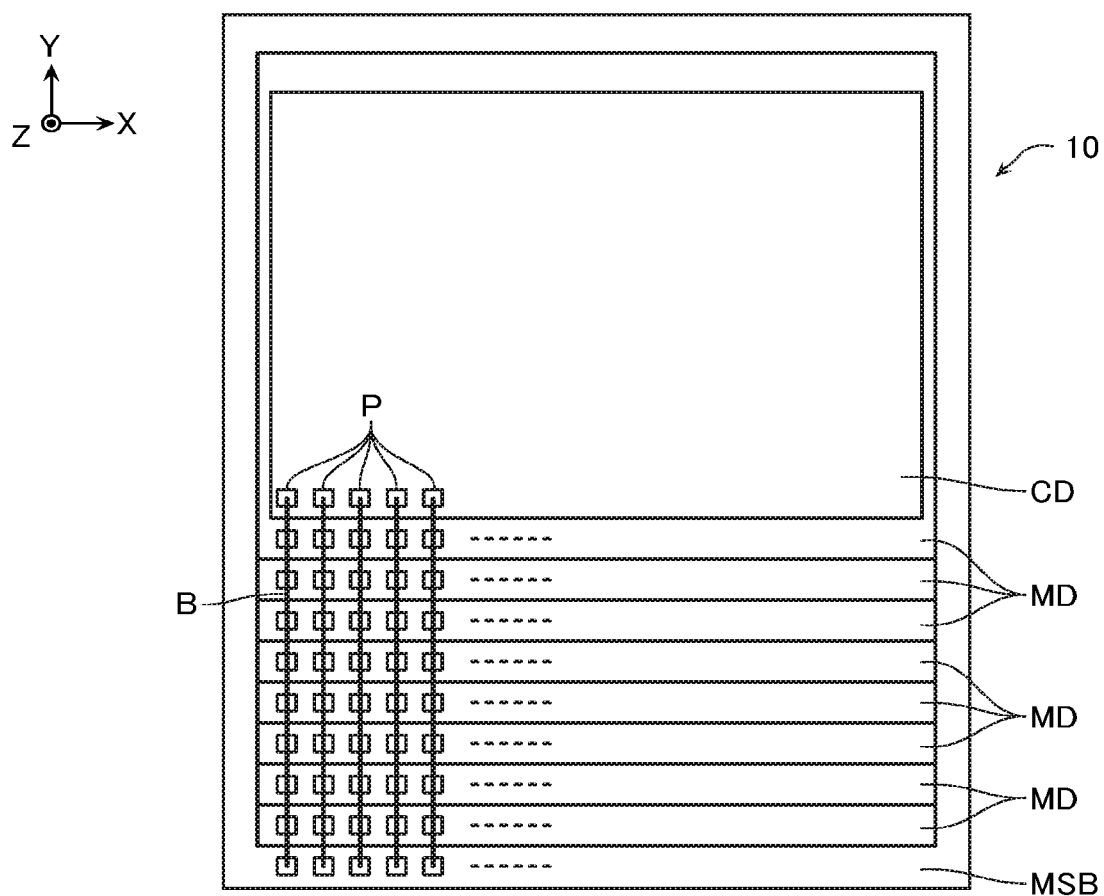
FIG. 3 is a schematic plan view illustrating the exemplary configuration.

FIG. 2 is a schematic side view illustrating an exemplary configuration of the memory system 10 according to the embodiment. FIG. 3 is a schematic plan view illustrating the exemplary configuration. For convenience of description, FIG. 2 and FIG. 3 omit parts of a configuration.

As illustrated in FIG. 2, the memory system 10 according to the embodiment includes a mounting substrate MSB, the plurality of memory dies MD, and the controller die CD. Pad electrodes P are disposed in a region of an end portion in the Y-direction of an upper surface of the mounting substrate MSB. A region other than the end portion in the Y-direction of the upper surface of the mounting substrate MSB is bonded to a lower surface of the memory die MD via an adhesive or the like. The plurality of memory dies MD are stacked on the mounting substrate MSB. The pad electrodes P are disposed in regions of end portions in the Y-direction of the upper surfaces of the memory dies MD. Regions other than the end portions in the Y-direction of the upper surfaces of the memory dies MD are bonded to lower surfaces of other memory dies MD or the lower surface of the controller die CD via adhesives or the like. The controller die CD is stacked on the memory die MD. The pad electrodes P are disposed in a region of an end portion in the Y-direction of the upper surface of the controller die CD.

As illustrated in FIG. 3, the mounting substrate MSB, the plurality of memory dies MD, and the controller die CD each include the plurality of pad electrodes P arranged in the X-direction. The plurality of respective pad electrodes P disposed in the mounting substrate MSB, the plurality of memory dies MD, and the controller die CD are connected to one another via bonding wires B.

Note that the configuration illustrated in FIG. 2 and FIG. 3 are merely examples, and specific configurations are appropriately adjustable. For example, in the example illustrated in FIG. 2 and FIG. 3, the controller die CD is stacked on the plurality of memory dies MD. The memory dies MD and the controller die CD are connected with the bonding wires B. The plurality of memory dies MD and the controller die CD are included in one package. However, the controller die CD may be included in a package different from a package of the memory dies MD. Additionally, the plurality of memory dies MD and the controller die CD may be connected to one another via through electrodes or the like, not the bonding wires B.

Figure 4:
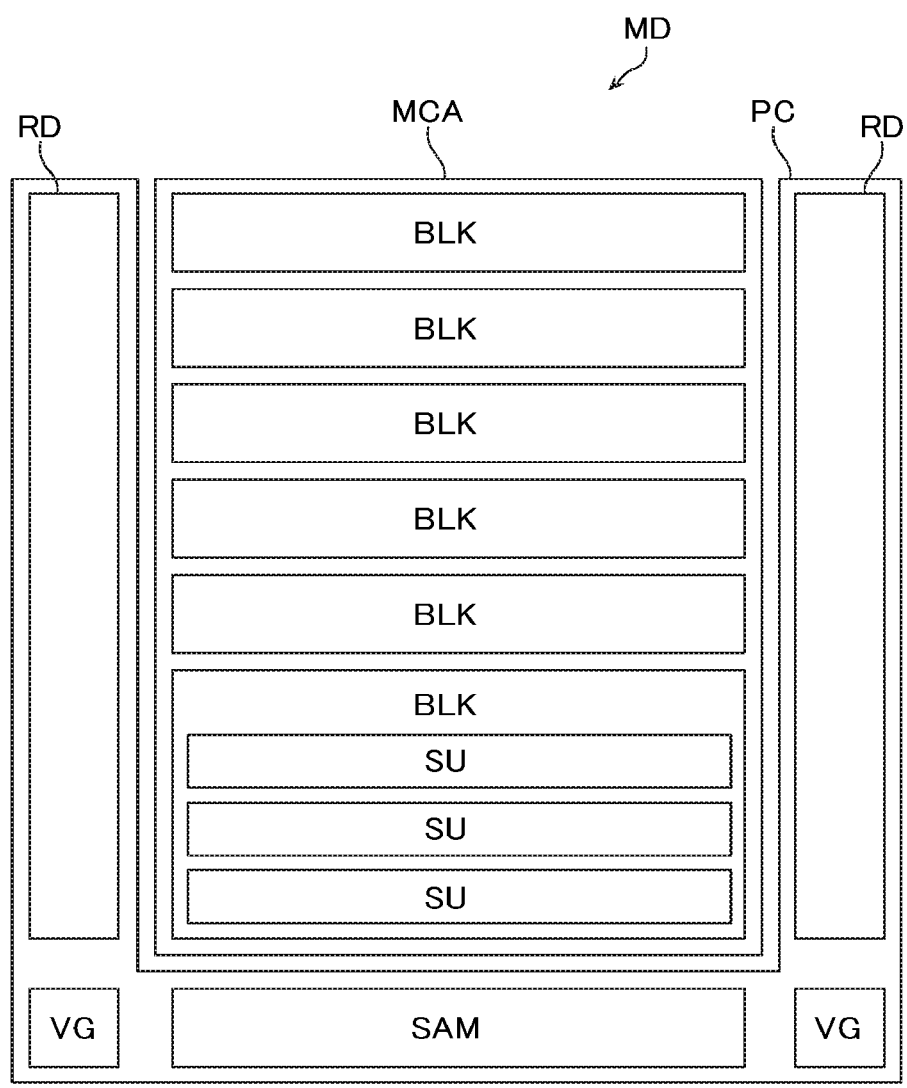
FIG. 4 is a schematic block diagram illustrating a configuration of a memory die MD.
Figure 5:
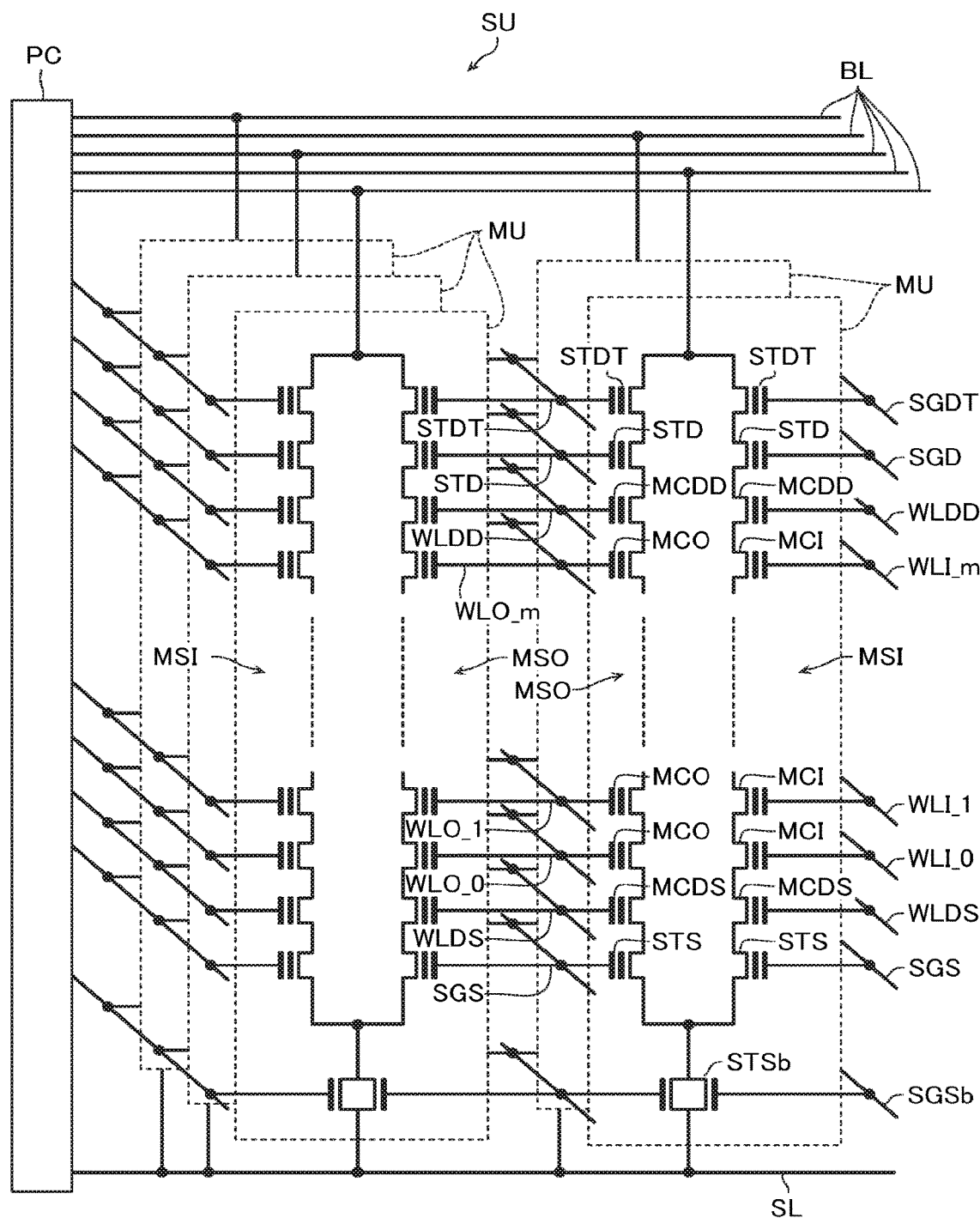
FIG. 5 is a schematic equivalent circuit diagram illustrating a configuration of a part of the memory die MD.

FIG. 4 is a schematic block diagram illustrating a configuration of the memory die MD. FIG. 5 is a schematic equivalent circuit diagram illustrating a configuration of a part of the memory die MD.

As illustrated in FIG. 4, the memory die MD includes a memory cell array MCA and a peripheral circuit PC that controls the memory cell array MCA.

The memory cell array MCA includes a plurality of memory blocks BLK. The memory block BLK includes a plurality of string units SU. For example, as illustrated in FIG. 5, the string unit SU includes a plurality of memory units MU. The plurality of memory units MU each include one memory string MSI and one memory string MSO. One ends of these memory strings MSI and MSO are connected to respective drain-side select transistors STD and STDT, and are connected to a common bit line BL via the drain-side select transistors STD and STDT. The other ends of the memory strings MSI and MSO are connected to common source-side select transistors STS and STSb and are connected to a common source line SL via the source-side select transistors STS and STSb.

The memory string MSI includes the m+1 (m is an integer of one or more) memory cells MCI connected in series. The memory string MSO includes the m+1 memory cells MCO connected in series. The memory cells MCI and MCO are field-effect type transistors each include a semiconductor layer, a gate insulating layer, and a gate electrode. The semiconductor layer functions as a channel region. The gate insulating layer includes a charge storage layer that can store data. Threshold voltages of the memory cells MCI and MCO change according to electric charge amounts in the charge storage layers. Gate electrodes of the m+1 memory cells MCI are connected to respective word lines WLI_0 to WLI_m. Gate electrodes of the m+1 memory cells MCO are connected to respective word lines WLO_0 to WLO_m. The respective word lines WLI_0 to WLI_m and WLO_0 to WLO_m are connected to all of the memory units MU in the memory block BLK.

The memory strings MSI and MSO include one or a plurality of dummy memory cells MCDD connected between the plurality of memory cells MCI and MCO and the drain-side select transistors STD. The memory strings MSI and MSO include one or a plurality of dummy memory cells MCDS connected between the plurality of memory cells MCI and MCO and the source-side select transistors STS. The dummy memory cells MCDD and MCDS are configured similarly to the memory cells MCI and MCO. However, the dummy memory cells MCDD and MCDS are not used to store data. A gate electrode of the dummy memory cell MCDD is connected to a dummy word line WLDD. A gate electrode of the dummy memory cell MCDS is connected to a dummy word line WLDS. The respective dummy word lines WLDD and WLDS are connected to all of the memory units MU in the memory block BLK.

Each of the select transistors (STD, STDT, STS, STSb) is a field-effect type transistor that includes a semiconductor layer, a gate insulating layer, and a gate electrode. The semiconductor layer functions as a channel region. A gate electrode of the drain-side select transistor STDT is connected to a drain-side select gate line SGDT. The drain-side select gate line SGDT is connected to all of the memory units MU in the memory block BLK. A gate electrode of the drain-side select transistor STD is connected to the drain-side select gate line SGD. The drain-side select gate line SGD is connected to all of the memory units MU in the string unit SU. Gate electrodes of the source-side select transistors STS and STSb are connected to source-side select gate lines SGS and SGSb, respectively. The respective source-side select gate lines SGS and SGSb are connected to all of the memory units MU in the memory block BLK.

For example, as illustrated in FIG. 4, the peripheral circuit PC includes row decoders RD connected to the memory cell array MCA, a sense amplifier module SAM connected to the memory cell array MCA, and voltage generation circuits VG connected to the row decoders RD and the sense amplifier module SAM. The peripheral circuit PC includes, for example, a sequencer, an address register, and a status register (not illustrated).

The row decoder RD transfers an operating voltage generated in the voltage generation circuit VG to the word lines WLI or WLO and the select gate lines (SGDT, SGD, SGS, SGSb) designated by address data.

The sense amplifier module SAM includes a plurality of sense amplifier units (not illustrated) disposed corresponding to the plurality of bit lines BL (FIG. 5). The sense amplifier unit includes a sense transistor that includes a gate electrode electrically connected to the bit line BL, a plurality of data latch circuits connected to a drain electrode of the sense transistor, and a voltage adjustment circuit configured to adjust a voltage of the bit line BL in accordance with data of one of the plurality of data latch circuits.

The voltage generation circuit VG includes a plurality of voltage generation units. For example, the plurality of voltage generation units may be step up circuits, such as charge pump circuits, or may be step down circuits, such as regulators. The voltage generation circuit VG generates different voltages having a plurality of patterns of magnitudes in a data read operation, a write operation, and the like and supplies the voltages to the row decoders RD and the sense amplifier module SAM.

Figure 6:
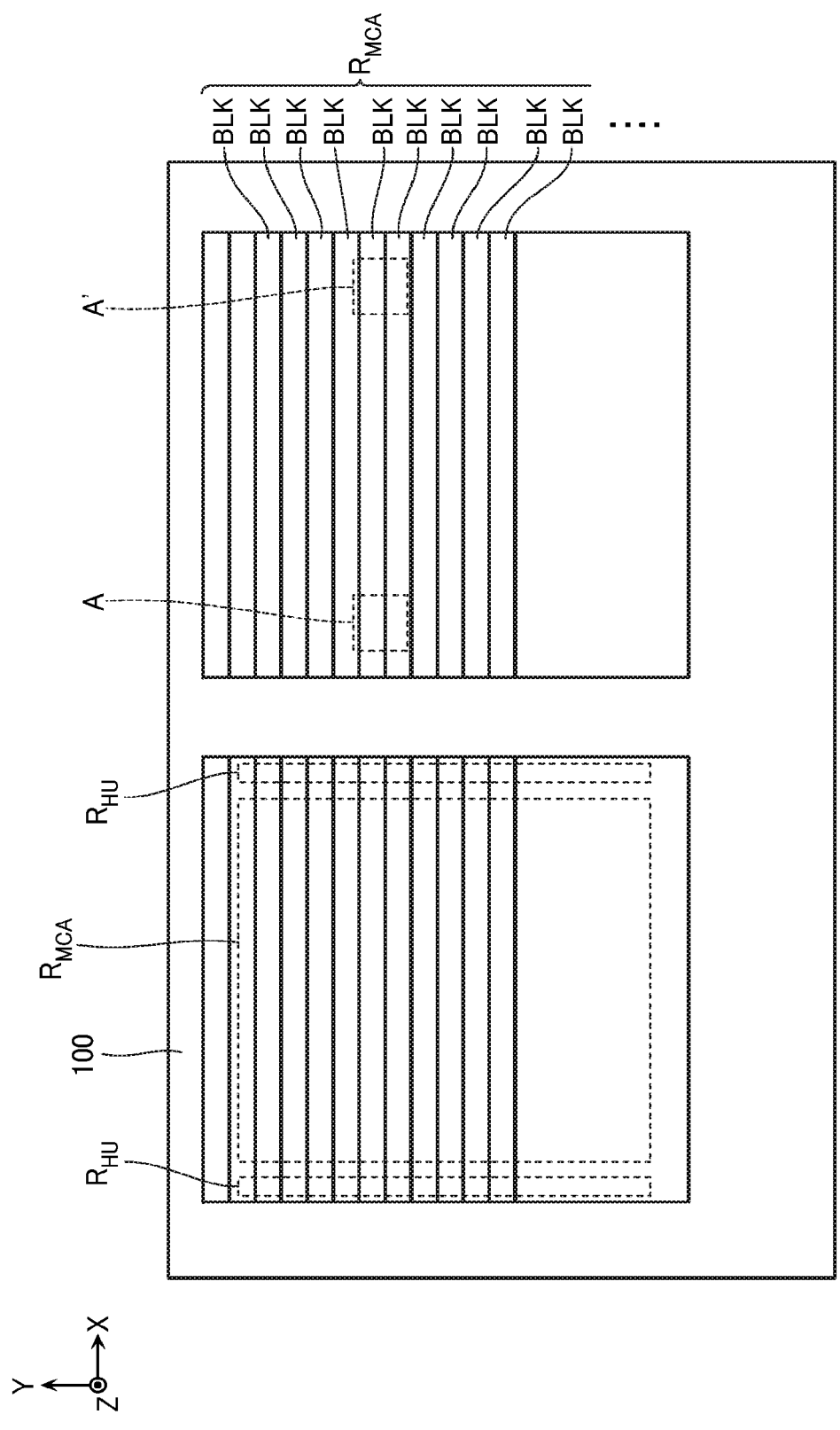
FIG. 6 is a schematic plan view illustrating a configuration of a part of the memory die MD.
Figure 7:
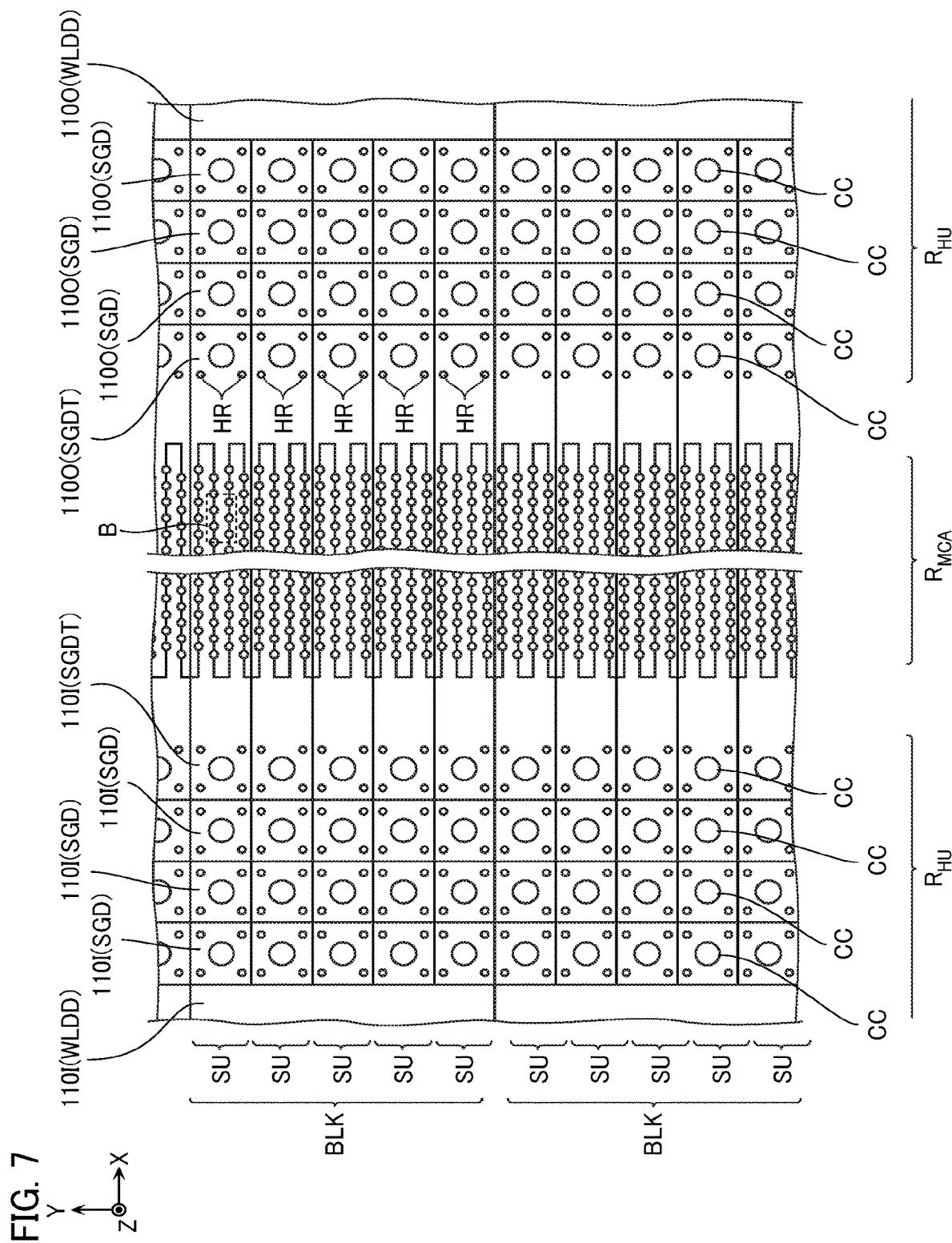
FIG. 7 is a schematic plan view illustrating enlarged parts of a part indicated by A and a part indicated by A' in a structure illustrated in FIG. 6.
Figure 8:
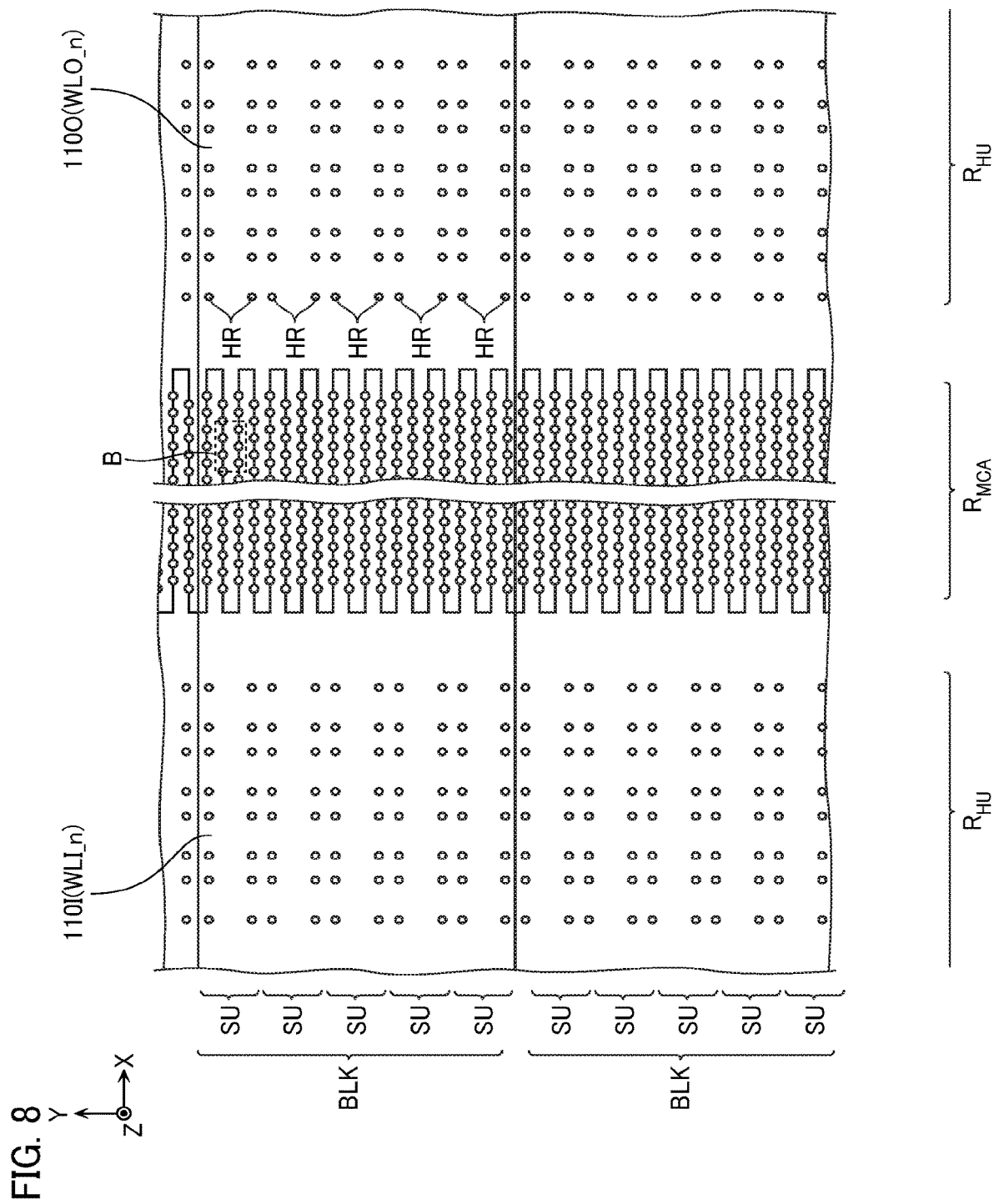
FIG. 8 is a schematic plan view illustrating the enlarged parts of the part indicated by A and the part indicated by A' in the structure illustrated in FIG. 6.
Figure 9:
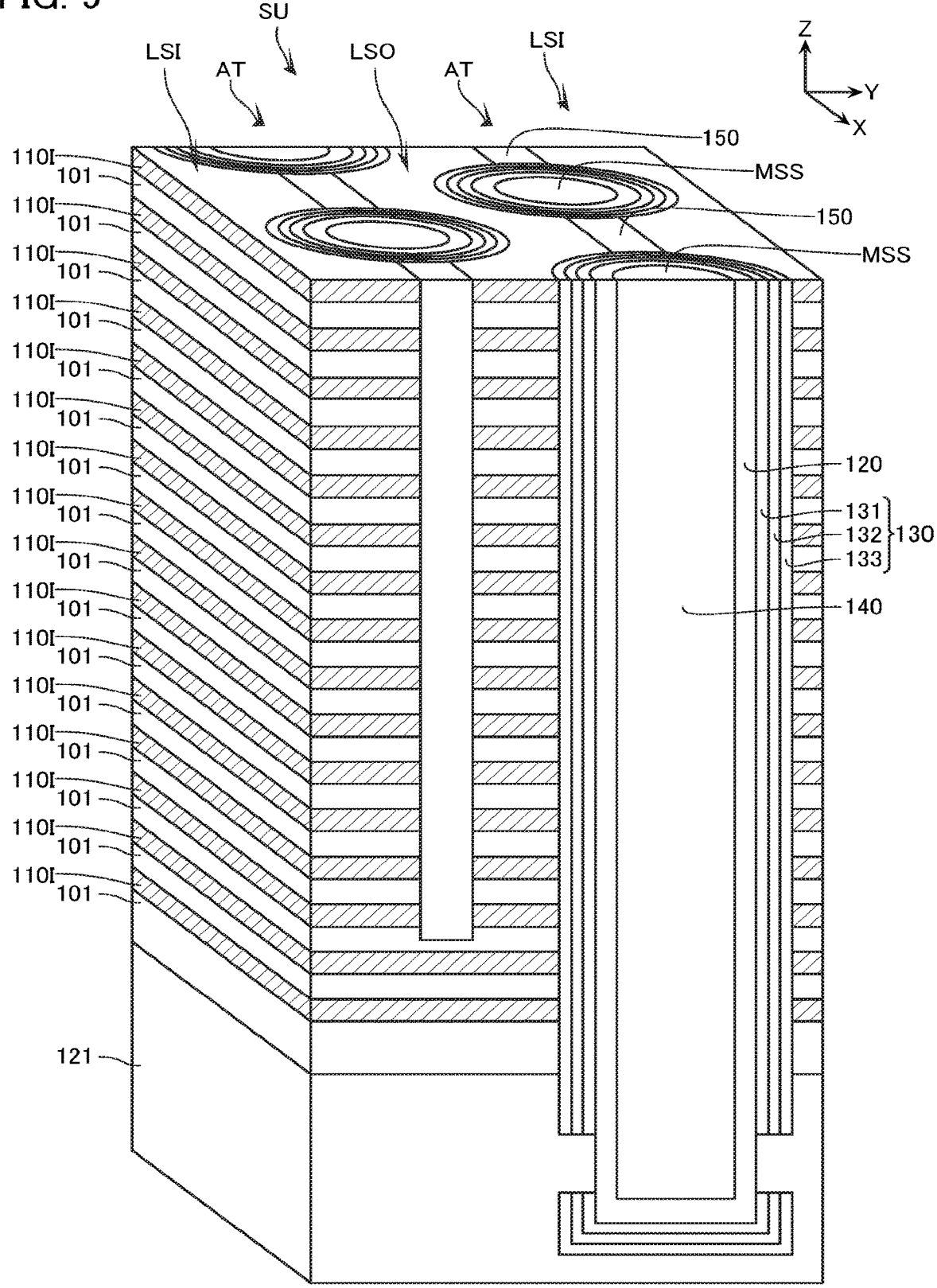
FIG. 9 is a schematic perspective view illustrating a configuration of a part of the memory die MD.
Figure 10:
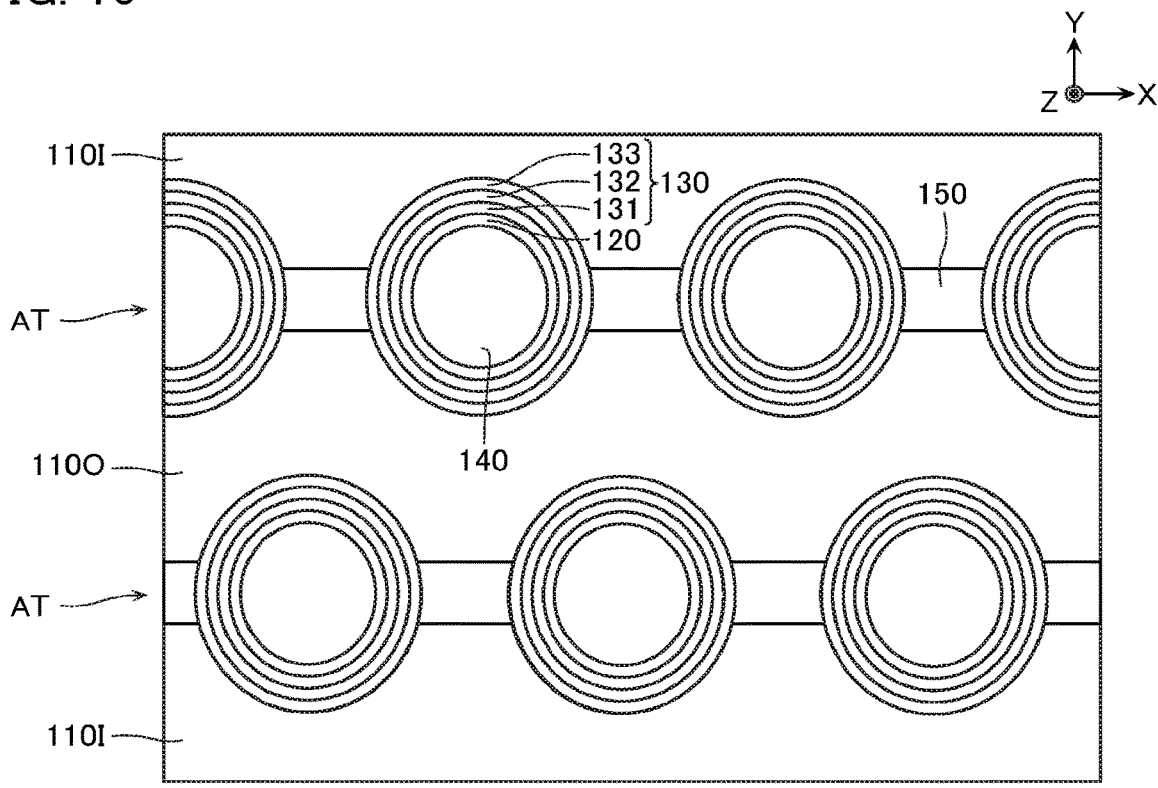
FIG. 10 is a schematic plan view illustrating an enlarged part indicated by B in FIG. 7 and FIG. 8.

Next, with reference to FIG. 6 to FIG. 10, an exemplary configuration of the semiconductor memory device according to the embodiment will be described. FIG. 6 is a schematic plan view illustrating a configuration of a part of the memory die MD. FIG. 7 and FIG. 8 are schematic plan views illustrating enlarged parts of a part indicated by A and a part indicated by A' in a structure illustrated in FIG. 6. However, FIG. 8 omits parts of the structure illustrated in FIG. 7. FIG. 9 is a schematic perspective view illustrating a configuration of a part of the memory die MD. FIG. 10 is a schematic plan view illustrating an enlarged part indicated by B in FIG. 7 and FIG. 8.

As illustrated in FIG. 6, the memory die MD includes a semiconductor substrate 100. In the illustrated example, the semiconductor substrate 100 includes two memory cell array regions $R_{MCA}$ arranged in the X-direction. Hook-up regions $R_{HU}$ are disposed at positions aligned in the X-direction with the memory cell array region $R_{MCA}$.

The semiconductor substrate 100 is a semiconductor substrate of, for example, a single-crystal silicon (Si) containing p-type impurities. An n-type well containing n-type impurities and a p-type well containing p-type impurities are disposed on an upper surface of the semiconductor substrate. On the surface of the semiconductor substrate 100, for example, a transistor, a wiring, and the like constituting at least a part of the peripheral circuit PC (FIG. 4) are disposed.

The memory cell array region $R_{MCA}$ includes a plurality of memory blocks BLK arranged in the Y-direction. For example, as illustrated in FIG. 7, the memory block BLK includes the plurality of string units SU arranged in the Y-direction.

For example, as illustrated in FIG. 9, the string unit SU includes a plurality of stacked structures LSI and LSO arranged in alternation in the Y-direction and trench structures AT respectively disposed between two of the plurality of stacked structures LSI and LSO. The stacked structure LSI includes, for example, m+9 conductive layers 110I stacked in the Z-direction. The stacked structure LSO, for example, includes m+9 conductive layers 110O stacked in the Z-direction. The trench structure AT includes a plurality of memory string structures MSS arranged in the X-direction. The memory string structures MSS each include a semiconductor layer 120 that extends in the Z-direction and has an approximately closed-bottomed cylindrical shape, a gate insulating layer 130 disposed between the stacked structures LSI and LSO and the semiconductor layer 120, and an insulating layer 140 of silicon oxide ($SiO_2$) or the like disposed at the center part of the semiconductor layer 120. Insulating layers 150 of silicon oxide ($SiO_2$) or the like are respectively disposed between two of the plurality of memory string structures MSS arranged in the X-direction.

The conductive layers 110I and 110O are approximately plate-shaped conductive layers extending in the X-direction and are stacked films of, for example, titanium nitride (TiN) and tungsten (W) or conductive layers of, for example, polycrystalline silicon (Si) into which impurities are injected. Between two of the plurality of conductive layers 110I and 110O arranged in the Z-direction, insulating layers 101, such as silicon oxide ($SiO_2$), are respectively disposed.

Among the plurality of conductive layers 110I and 110O, ones positioned at the first counted from the lower side each function as the gate electrodes of the source-side select transistors STSb and the source-side select gate line SGSb.

Among the plurality of conductive layers 110I and 110O, ones positioned at the second counted from the lower side each function as the gate electrodes of the source-side select transistors STS and the source-side select gate line SGS.

Among the plurality of conductive layers 110I and 110O, ones positioned at the third counted from the lower side each function as the gate electrodes of the dummy memory cells MCDS and the dummy word line WLDS.

Among the plurality of conductive layers 110I, ones positioned at the fourth to the m+4-th counted from the lower side each function as the gate electrodes of the memory cells MCI and one of the word lines WLI_0 to WLI_m.

Among the plurality of conductive layers 110O, ones positioned at the fourth to the m+4-th counted from the lower side each function as the gate electrodes of the memory cells MCO and one of the word lines WLO_0 to WLO_m.

Among the plurality of conductive layers 110I and 110O, ones positioned at the m+5-th counted from the lower side each function as the gate electrodes of the dummy memory cells MCDD and the dummy word line WLDD.

Among the plurality of conductive layers 110I, ones positioned at the m+6-th to the m+8-th counted from the lower side function as the gate electrodes of the drain-side select transistors STD and the drain-side select gate line SGD.

Among the plurality of conductive layers 110O, ones positioned at the m+6-th to the m+8-th counted from the lower side each function as the gate electrodes of the drain-side select transistors STD and the drain-side select gate line SGD.

Among the plurality of conductive layers 110I and 110O, ones positioned at the m+9-th counted from the lower side each function as the gate electrodes of the drain-side select transistors STDT and the drain-side select gate line SGDT.

FIG. 8 is a X-Y cross-sectional surface illustrating a configuration of the n+3-th (n is an integer of one or more to equal to or less than m+1) conductive layers 110I and 110O counted from the lower side. In the cross-sectional surface illustrated in FIG. 8, among the plurality of conductive layers 110I arranged in the Y-direction, one end portions in the X-direction (left end portions in FIG. 8) included in one memory block BLK are connected in common. Among the plurality of conductive layers 110O arranged in the Y-direction, one end portions in the X-direction (right end portions in FIG. 8) included in one memory block BLK are connected in common.

FIG. 7 is a schematic plan view illustrating a configuration of the m+5-th to m+9-th conductive layers 110I and 110O counted from the lower side. In the plane as illustrated in FIG. 7, among the plurality of conductive layers 110I arranged in the Y-direction, one end portions in the X-direction (left end portions in FIG. 7) included in one string unit SU are connected in common. Among the plurality of conductive layers 110O arranged in the Y-direction, one end portions in the X-direction (right end portions in FIG. 7) included in one string unit SU are connected in common.

The semiconductor layer 120 (FIG. 9) is a semiconductor layer of, for example, non-doped polycrystalline silicon (Si). As described above, the semiconductor layer 120 has the approximately closed-bottomed cylindrical shape. The semiconductor layers 120 function as the channel regions of the plurality of memory cells MCI and MCO, the dummy memory cells MCDD and MCDS, and the select transistors (STSb, STS, STD, STDT) corresponding to the memory strings MSI and MSO (FIG. 5).

To a lower end of the semiconductor layer 120, a semiconductor layer 121 (FIG. 9) is connected. The semiconductor layer 121 is a semiconductor layer of, for example, polycrystalline silicon (Si) containing n-type impurities, such as phosphorus (P). The semiconductor layer 121 functions as the source line SL (FIG. 5).

Although the illustration is omitted, to the upper end of the semiconductor layer 120, an impurity layer of, for example, polycrystalline silicon (Si) containing n-type impurities, such as phosphorus (P), is formed. The semiconductor layer 120 is electrically connected to the bit line BL (FIG. 5) via this impurity layer.

The gate insulating layer 130 has an approximately cylindrical shape and extends in the Z-direction along the outer peripheral surface of the semiconductor layer 120. The gate insulating layer 130 includes a tunnel insulating layer 131 of silicon oxide ($SiO_2$) or the like, a charge storage film 132 of silicon nitride (SiN) or the like, and a block insulating layer 133 of silicon oxide ($SiO_2$) or the like disposed from the semiconductor layer 120 side to the conductive layers 110I and 110O side.

For example, as illustrated in FIG. 7, the hook-up region $R_{HU}$ includes a plurality of contacts CC and supporting structures HR disposed at the proximity of the plurality of contacts CC. The plurality of contacts CC are connected to the respective conductive layers 110I and 110O. The respective supporting structures HR pass through the plurality of conductive layers 110I and 110O stacked in the Z-direction.

The supporting structure HR may be an insulating layer of silicon oxide (SiO$_2$) or the like.

[Threshold Voltages of Memory Cells MCI and MCO]

Next, with reference to FIG. 11, the threshold voltages of the memory cells MCI and MCO will be described.

As described above, the memory cell array MCA includes the plurality of memory cells MCI and MCO. When the write operation is performed on the plurality of memory cells MCI and MCO, the threshold voltages of the memory cells MCI and MCO are controlled to a plurality of patterns of states.

Figure 11:
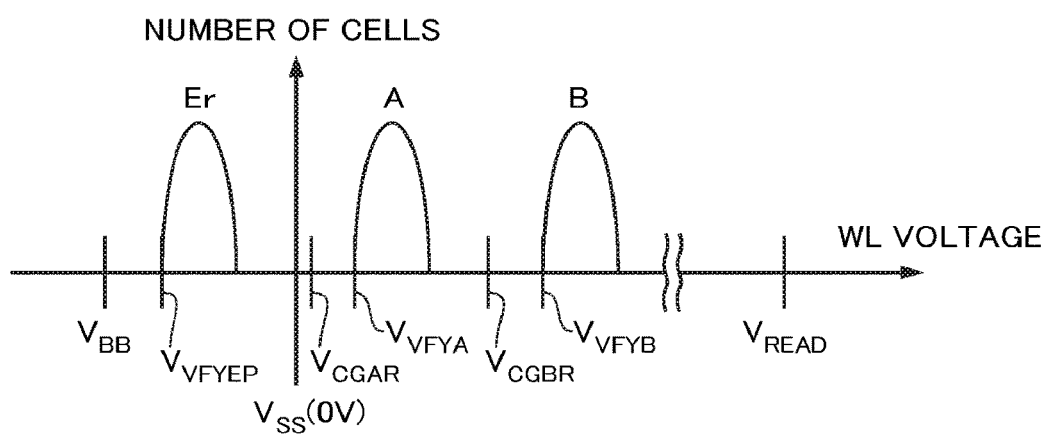
FIG. 11 is a schematic histogram for describing threshold voltages of memory cells MCI and MCO in which data of a plurality of bits are stored.

FIG. 11 is a schematic histogram for describing the threshold voltages of the memory cells MCI and MCO in which data of a plurality of bits are stored. The horizontal axis indicates the voltages of the word lines WLI and WLO, and the vertical axis indicates the numbers of memory cells MCI and MCO.

FIG. 11 illustrates three distributions of the threshold voltages of the memory cells MCI and MCO. For example, the threshold voltages of the memory cells MCI and MCO controlled to an Er state are larger than a read blocking voltage $V_{BB}$ and smaller than a read voltage $V_{CGAR}$. Note that a magnitude of the smallest threshold voltage included in the threshold distribution in the Er state is around a magnitude of a verify voltage $V_{VFYEP}$. The threshold voltages of the memory cells MCI and MCO controlled to an A state is larger than the read voltage $V_{CGAR}$ and smaller than a read voltage $V_{CGBR}$ Note that a magnitude of the smallest threshold voltage included in the threshold distribution in the A state is around a magnitude of a verify voltage $V_{VFYA}$. Threshold voltages of the memory cells MCI and MCO controlled to a B state are larger than the read voltage $V_{CGBR}$. A magnitude of the smallest threshold voltage included in the threshold distribution in the B state is around a magnitude of a verify voltage $V_{VFYB}$. The threshold voltages of all of the memory cells MCI and MCO are smaller than a read pass voltage $V_{READ}$.

One-bit data or a plurality of bits of data is assigned to each of the threshold distributions.

For example, when three-bit data is assigned to the memory cells MCI and MCO, the threshold voltages of the memory cells MCI and MCO are controlled so as to belong to any of $2^3=8$ patterns of threshold distributions. Data of any of "0, 0, 0", "0, 0, 1", "0, 1, 0", "0, 1, 1", "1, 0, 0", "1, 0, 1", "1, 1, 0", and "1, 1, 1" is assigned to the eight patterns of the threshold distributions.

For example, when one-bit data is assigned to the memory cells MCI and MCO, the threshold voltages of the memory cells MCI and MCO are controlled so as to belong to any of $2^1=2$ patterns of threshold distributions. Data of any of "0" and "1" is assigned to the two patterns of the threshold distributions.

[Data Read Operation]

Figure 12:
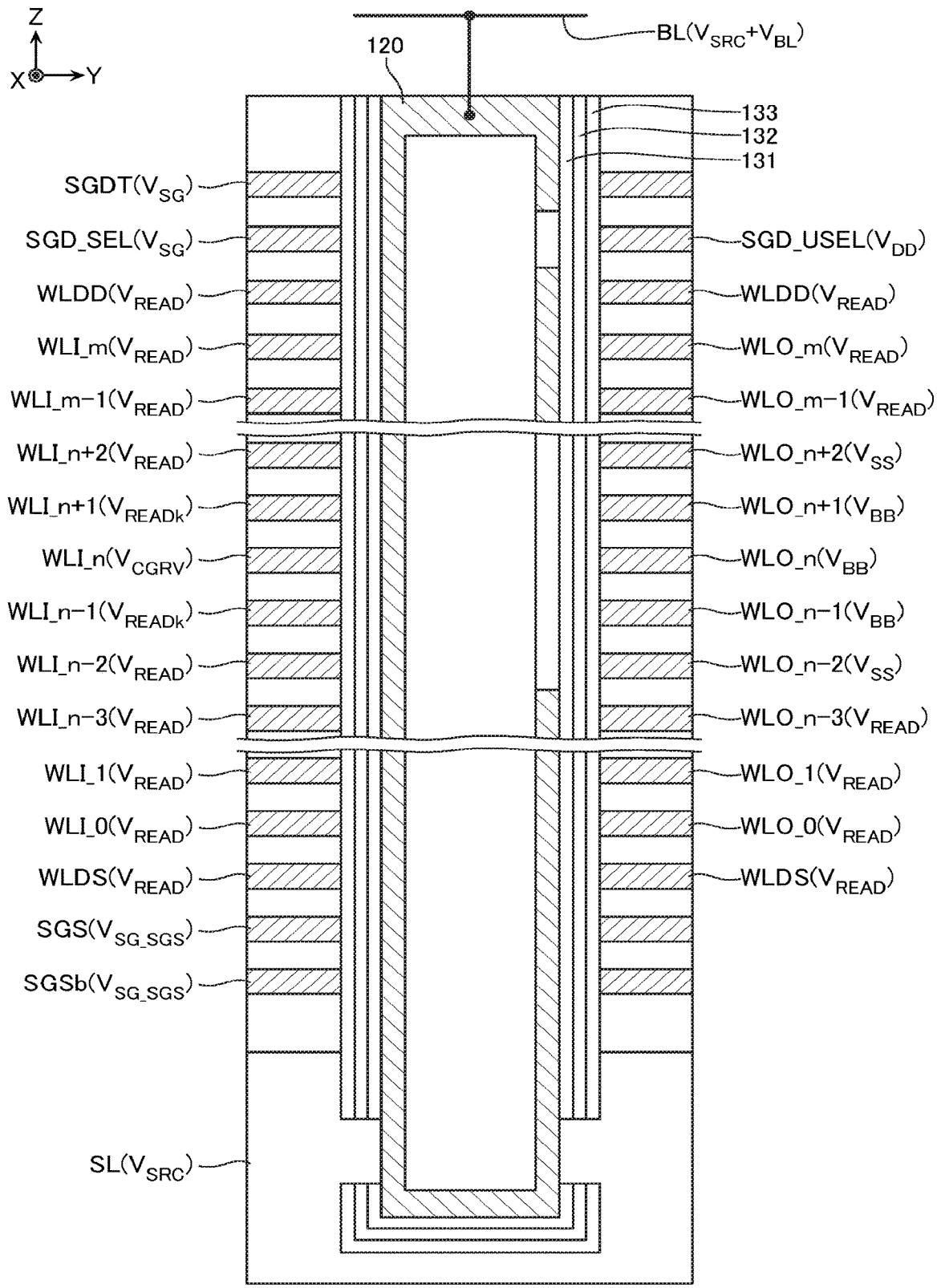
FIG. 12 is a schematic cross-sectional view for describing a data read operation according to the first embodiment.

Next, with reference to FIG. 12, the data read operation of the semiconductor memory device according to the embodiment will be briefly described. FIG. 12 is a schematic cross-sectional view for describing the data read operation.

Note that the data read operation according to the embodiment is performed on all of the memory cells MCI or MCO included in the designated string unit SU in the designated memory block BLK and connected to the designated word line WLI or word line WLO. Hereinafter, the configuration including the plurality of memory cells MCI or MCO is referred to as a page in some cases.

In the following description, an example in which the data read operation is performed on the page corresponding to the memory strings MSI and the word line WLI_n will be described. In the following description, among the drain-side select gate lines SGD, one corresponding to the selected memory string MSI is referred to as a drain-side select gate line SGD_SEL and one corresponding to the unselected memory string MSO is referred to as a drain-side select gate line SGD_USEL in some cases.

In the data read operation, for example, as illustrated in FIG. 12, a voltage $V_{SRC}+V_{BL}$ is supplied to the bit line BL. A voltage $V_{SRC}$ is supplied to the source line SL. The voltage $V_{SRC}$ is larger than a ground voltage $V_{SS}$. The voltage $V_{SRC}+V_{BL}$ is larger than the voltage $V_{SRC}$.

A voltage $V_{SG}$ is supplied to the drain-side select gate lines SGDT and SGD_SEL. The voltage $V_{SG}$ is larger than the voltage $V_{SRC}+V_{BL}$. A difference between the voltage $V_{SG}$ and the voltage $V_{SRC}+V_{BL}$ is larger than a threshold voltage when the drain-side select transistors STDT and STD are operated as NMOS transistors. Therefore, electron channels are formed in channel regions of the drain-side select transistors STDT and STD corresponding to the selected memory string MSI.

A voltage $V_{DD}$ is supplied to the drain-side select gate line SGD_USEL. The voltage $V_{DD}$ is larger than the voltage Vs. A difference between the voltage $V_{DD}$ and the voltage $V_{SRC}+V_{BL}$ is smaller than a threshold voltage when the drain-side select transistor STD is operated as the NMOS transistor. Accordingly, channels are not formed in channel regions of the drain-side select transistors STD corresponding to the unselected memory strings MSO.

The read pass voltage $V_{READ}$ is supplied to the word lines WLI_0 to WLI_n−2 and WLI_n+2 to WLI_m and the dummy word lines WLDD corresponding to them. The read pass voltage $V_{READk}$ is supplied to the word lines WLI_n−1 and WLI_n+1. The read pass voltage $V_{READk}$ is larger than the read pass voltage $V_{READ}$. Thus, electron channels are formed in the channel regions of the plurality of non-selected memory cells MCI.

A read voltage $V_{CGRV}$ is supplied to the selected word line WLI_n. For example, the read voltage $V_{CGRV}$ is any of the read voltages $V_{CGAR}$, $V_{CGBR}$ ... described with reference to FIG. 11. This forms or does not form the electron channel in the channel region of the selected memory cell MCI according to the data stored in the selected memory cell MCI.

The read pass voltage $V_{READ}$ is supplied to the word lines WLO_0 to WLO_n−3 and WLO_n+3 to WLO_m and the dummy word lines WLDD corresponding to them. Thus, electron channels are formed in the channel regions of the plurality of non-selected memory cells MCO.

The read blocking voltage $V_{BB}$ is supplied to the word lines WLO_n−1 to WLO_n+1. The ground voltage $V_{SS}$ is supplied to the word lines WLO_n−2 and WLO_n+2. Therefore, channels are not formed in the channel regions of the memory cells MCO connected to them.

Additionally, a voltage $V_{SG\_SGG}$ is supplied to the source-side select gate lines SGS and SGSb. The voltage $V_{SG\_SGS}$ is larger than the voltage $V_{SRC}+V_{BL}$. A difference between the voltage $V_{SG\_SGS}$ and the voltage $V_{SRC}+V_{BL}$ is larger than a threshold voltage when the source-side select transistors STS and STSb are operated as the NMOS transistors. Therefore, electron channels are formed in the channel regions of the source-side select transistors STS and STSb.

Here, when the electron channel is formed in the channel region of the selected memory cell MCI, a current flows through the bit line BL. On the other hand, when the electron channel is not formed in the channel region of the selected memory cell MCI, a current does not flow through the bit line BL. In the data read operation, by detecting the current in the bit line BL by the sense amplifier module SAM (FIG.

4), the data in the selected memory cell MCI can be read. In the following description, the operation that detects the current in the bit line BL by the sense amplifier module SAM (FIG. 4) is referred to as a sense operation in some cases.

In FIG. 12, the read blocking voltage $V_{BB}$ is supplied to the word lines WLO_n−1 to WLO_n+1 and the read pass voltage $V_{READ}$ is supplied to the word lines WLO_0 to WLO_n−3 and WLO_n+3 to WLO_m. However, the configuration is merely an example, and a specific method is appropriately adjustable. For example, the read blocking voltage $V_{BB}$ may be supplied to all of the word lines WLO_0 to WLO_m.

[Variation in Threshold Voltage]

For example, when data is written to the memory cell MCI connected to the word line WLI_n, electrons are accumulated in the charge storage film 132 (FIG. 9) in the memory cell MCI, thus adjusting the threshold voltage of the memory cell MCI. Next, when data is written to the memory cell MCO connected to the word line WLO_n, electrons are accumulated in the charge storage film 132 (FIG. 9) in the memory cell MCO, thus adjusting the threshold voltage of the memory cell MCO. In this respect, due to an electric field from the electrons accumulated in the charge storage film 132 in the memory cell MCO, the threshold voltage of the memory cell MCI varies in some cases.

Here, the phenomenon can be reduced by accumulating the holes in the channel region of the memory cell MCO. That is, when the holes are accumulated in the channel region of the memory cell MCO, a line of electric force generated from the electrons in the charge storage film 132 in the memory cell MCO can be cancelled by the holes.

Therefore, in the semiconductor memory device according to the embodiment, before the data read operation is performed on the memory cell MCI, the holes are charged to the channel region of the memory cell MCO. Hereinafter, the operation is referred to as a hole charge operation.

[Hole Charge Operation]

Figure 13:
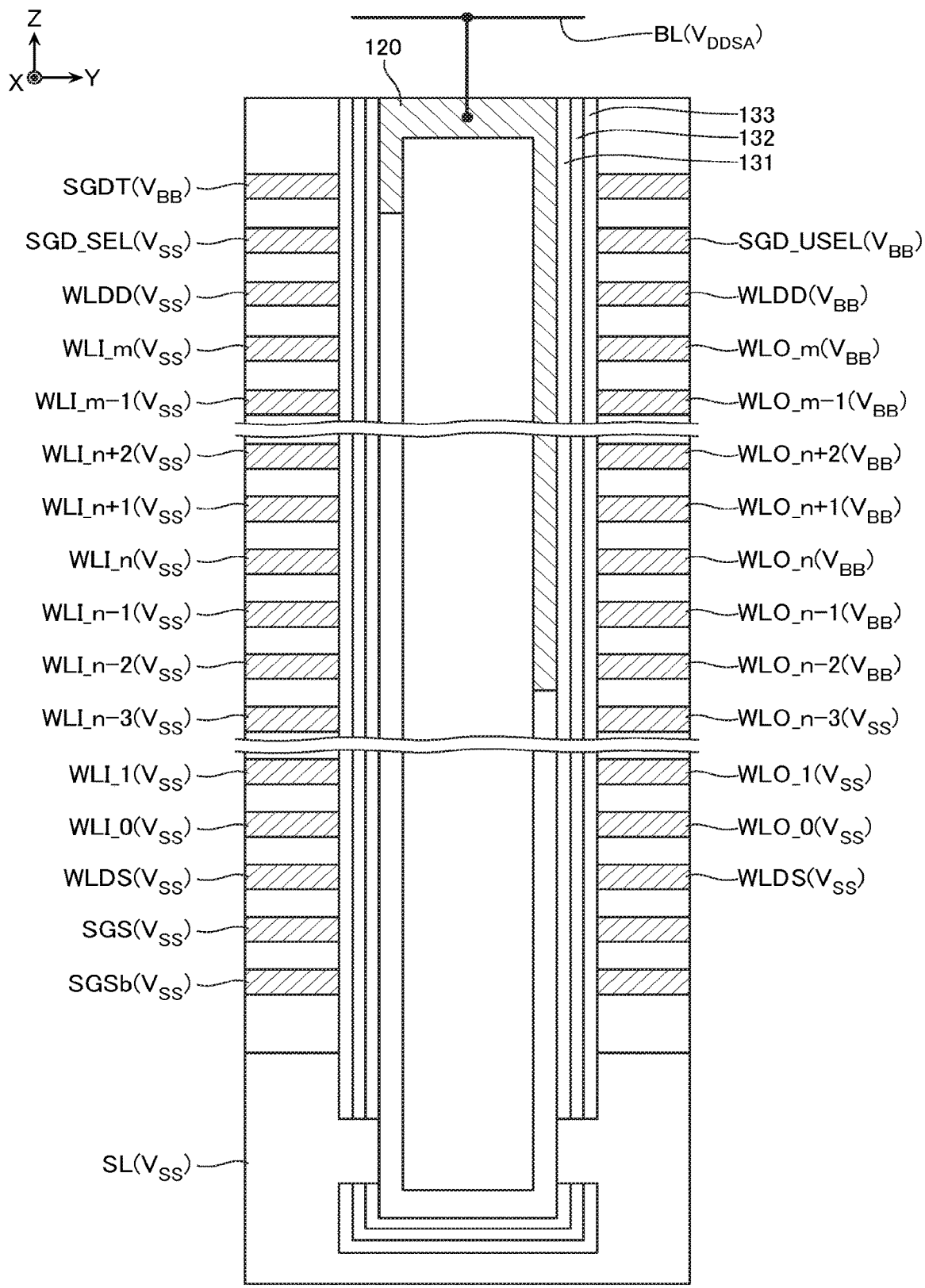
FIG. 13 is a schematic cross-sectional view for describing a hole charge operation according to the first embodiment.

Next, with reference to FIG. 13, the hole charge operation of the semiconductor memory device according to the embodiment will be briefly described. FIG. 13 is a schematic cross-sectional view for describing the hole charge operation.

For example, as illustrated in FIG. 13, in the hole charge operation, a voltage $V_{DDSA}$ is supplied to the bit line BL. The ground voltage $V_{SS}$ is supplied to the source line SL. The voltage $V_{DDSA}$ is larger than the voltage $V_{SRC}$.

The read blocking voltage $V_{BB}$ is supplied to the drain-side select gate line SGDT. Thus, a Gate Induced Drain Leakage (GIDL) is generated in the drain-side select transistor STDT and the holes are generated in the channel region of the drain-side select transistor STDT.

The ground voltage $V_{SS}$ is supplied to the drain-side select gate line SGD_SEL. Here, a difference between the ground voltage $V_{SS}$ and the voltage $V_{DDSA}$ is smaller than a threshold voltage when the drain-side select transistor STD is operated as a PMOS transistor. Therefore, a channel is not formed in the channel region of the drain-side select transistor STD corresponding to the selected memory string MSI.

The read blocking voltage $V_{BB}$ is supplied to the drain-side select gate line SGD_USEL. Here, a difference between the read blocking voltage $V_{BB}$ and the voltage $V_{DDSA}$ is larger than a threshold voltage when the drain-side select transistor STD is operated as the PMOS transistor. Therefore, channels of the holes are formed in the channel regions of the drain-side select transistors STD corresponding to the unselected memory strings MSO.

The ground voltage $V_{SS}$ is supplied to the word lines WLI_0 to WLI_m and the dummy word lines WLDD and WLDS corresponding to them. Here, a difference between the ground voltage $V_{SS}$ and the voltage $V_{DDSA}$ is smaller than a threshold voltage when the memory cell MCI and the dummy memory cells MCDD and MCDS are operated as the PMOS transistors. Therefore, any channel is not formed in the channel region of the memory cell MCI or the dummy memory cell MCDD or MCDS corresponding to the selected memory string MSI.

The ground voltage $V_{SS}$ is supplied to the word lines WLO_0 to WLO_n−3 and the dummy word lines WLDS corresponding to them. Here, a difference between the ground voltage $V_{SS}$ and the voltage $V_{DDSA}$ is smaller than a threshold voltage when the memory cell MCO and the dummy memory cell MCDS are operated as the PMOS transistors. Therefore, channels are not formed in the channel regions of the memory cells MCO or the dummy memory cells MCDS connected to them.

The read blocking voltage $V_{BB}$ is supplied to the word lines WLO_n−2 to WLO_m and the dummy word lines WLDD corresponding to them. Here, a difference between the read blocking voltage $V_{BB}$ and the voltage $V_{DDSA}$ is larger than a threshold voltage when the memory cell MCO and the dummy memory cell MCDD are operated as the PMOS transistors. Therefore, the channels of the holes are formed in the channel regions of the memory cell MCO and the dummy memory cell MCDD connected to them.

The ground voltage $V_{SS}$ is supplied to the source-side select gate lines SGS and SGSb. Therefore, any channel is not formed in the channel region of the source-side select transistor STS or STSb.

This method allows generating the holes in the drain-side select transistor STDT and charging the channel region of the memory cell MCO corresponding to the word line WLO_n with the holes. Thus, the variation of the threshold voltage in the memory cell MCI can be reduced.

[Operation Including Hole Charge Operation and Data Read Operation]

Figure 14:
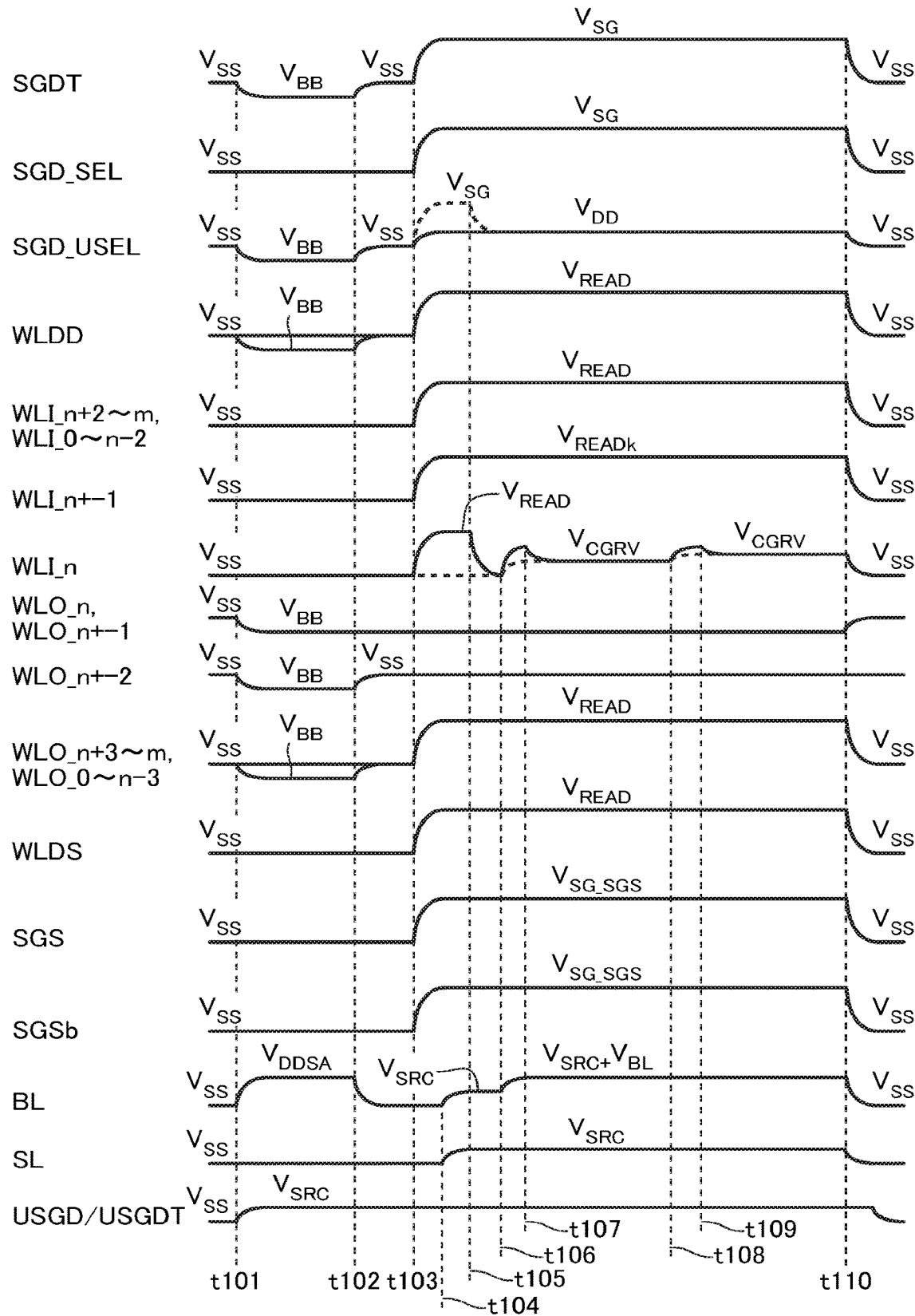
FIG. 14 is a schematic waveform diagram for describing the hole charge operation and the data read operation according to the first embodiment.

Next, with reference to FIG. 14, the hole charge operation and the data read operation of the semiconductor memory device according to the embodiment will be described in more detail. FIG. 14 is a schematic waveform diagram for describing the hole charge operation and the data read operation. Note that FIG. 14 also describes a voltage of the drain-side select gate lines USGD and USGDT corresponding to the unselected memory blocks BLK.

In the example of FIG. 14, at a timing t101, the ground voltage $V_{SS}$ is supplied to the drain-side select gate lines SGDT, SGD_SEL, SGD_USEL, USGD, and USGDT, the dummy word lines WLDD and WLDS, the word lines WLI_0 to WLI_m and WLO_0 to WLO_m, the source-side select gate lines SGS and SGSb, the bit line BL, and the source line SL.

At the timing t101, the hole charge operation is started. At the timing t101, the voltages described with reference to FIG. 13 is supplied to each wiring. The voltage $V_{SRC}$ is supplied to the drain-side select gate lines USGD and USGDT.

At a timing t102, the hole charge operation ends. At the timing t102, the voltage of word lines WLO_n−1 to WLO_n+1 is maintained at the read blocking voltage $V_{BB}$. The voltage of the drain-side select gate lines USGD and USGDT is maintained at the voltage $V_{SRC}$. The ground voltage $V_{SS}$ is supplied to the wirings other than them.

At a timing t103, the data read operation is started. At the timing t103, the voltage $V_{SG}$ is supplied to the drain-side select gate lines SGDT and SGD_SEL. The voltage $V_{DD}$ is supplied to the drain-side select gate line SGD_USEL. However, at the timing, the voltage $V_{SG}$ may be supplied to the drain-side select gate line SGD_USEL. The read pass voltage $V_{READ}$ is supplied to the word lines WLI_0 to WLI_n−2, WLI_n, WLI_n+2 to WLI_m, WLO_0 to WLO_n−3, and WLO_n+3 to WLO_m. However, at the timing, the voltage of the selected word line WLI_n may be maintained at the ground voltage $V_{SS}$. At the timing, the voltage $V_{READk}$ is supplied to the word lines WLI_n−1 and WLI_n+1. At the timing, the voltage $V_{SG\_SGS}$ is supplied to the source-side select gate lines SGS and SGSb.

At a timing t104, the voltage $V_{SRC}$ is supplied to the bit line BL.

At a timing t105, the ground voltage $V_{SS}$ is supplied to the selected word line WLI_n. When the voltage $V_{SG}$ is supplied to the drain-side select gate line SGD_USEL, at the timing, the voltage $V_{DD}$ is supplied to the drain-side select gate line SGD_USEL.

At a timing t106, a predetermined voltage larger than the read voltage $V_{CGRV}$ is supplied to the selected word line WLI_n. However, at the timing, the read voltage $V_{CGRV}$ may be supplied to the selected word line WLI_n. At the timing, the voltage $V_{SRC}+V_{BL}$ is supplied to the bit line BL.

At a timing t107, the read voltage $V_{CGRV}$ is supplied to the selected word line WLI_n.

Between the timing t107 and t108, the sense operation by the sense amplifier module SAM (FIG. 4) is performed.

At a timing t108, a predetermined voltage larger than the read voltage $V_{CGRV}$ is supplied to the selected word line WLI_n. However, at the timing, the read voltage $V_{CGRV}$ may be supplied to the selected word line WLI_n. At the timing, the voltage $V_{SRC}+V_{BL}$ is supplied to the bit line BL.

At a timing t109, the read voltage $V_{CGRV}$ is supplied to the selected word line WLI_n.

Note that the read voltage $V_{CGRV}$ supplied to the selected word line WLI_n at the timing t108 or the timing t109 differs from the read voltage $V_{CGRV}$ supplied to the selected word line WLI_n at the timing t106 or the timing t107.

Between the timings t109 and t110, the sense operation by the sense amplifier module SAM (FIG. 4) is performed.

At a timing t110, the ground voltage $V_{SS}$ is supplied to each wiring.

Note that in the illustrated example, at the timing t103, the electron channel is formed on the outer peripheral surface of the semiconductor layer 120 to electrically conduct the bit line BL and the source line SL via the electron channel. The operation allows reducing generation of hot electrons or the like and reducing erroneous writing or the like in association with the data read operation.

Here, in the embodiment, the hole charge operation is performed from the timings t101 to t102 to accumulate the holes on a part of the outer peripheral surface of the semiconductor layer 120. However, when the electron channel is formed on the entire outer peripheral surface of the semiconductor layer 120 at the timing t103, the accumulated holes vanish.

Therefore, in the embodiment, from the timings t101 to t110, voltages of the word lines WLO_n−1 to WLO_n+1 are maintained at the read blocking voltage $V_{BB}$. The method allows maintaining the holes in a part of the region on the outer peripheral surface of the semiconductor layer 120 while reducing generation of hot electrons or the like. Note that voltages of the word lines WLO_n−1 to WLO_n+1 are preferably maintained at the read blocking voltage $V_{BB}$ at least until a timing when all of the sense operations included in the data read operation end.

FIG. 14 illustrates an example in which data corresponding to the first read voltage $V_CCR_V$ is read from the timings t106 to t108, and data corresponding to the second read voltage $V_{CGRV}$ is read from the timings t108 to t110. However, the number of read voltages $V_{CGRV}$ used in the data read operation is appropriately adjustable. For example, to read one data corresponding to one read voltage $V_{CGRV}$ in the data read operation, processes performed from the timing t108 to the timing t110 are omitted. For example, to read data corresponding to the three or more read voltages $V_{CGRV}$ in the data read operation, in addition to the processes performed from the timings t106 to t108 and the processes performed from the timings t108 to t110, processes similar to the processes are further performed.

Second Embodiment

Figure 15:
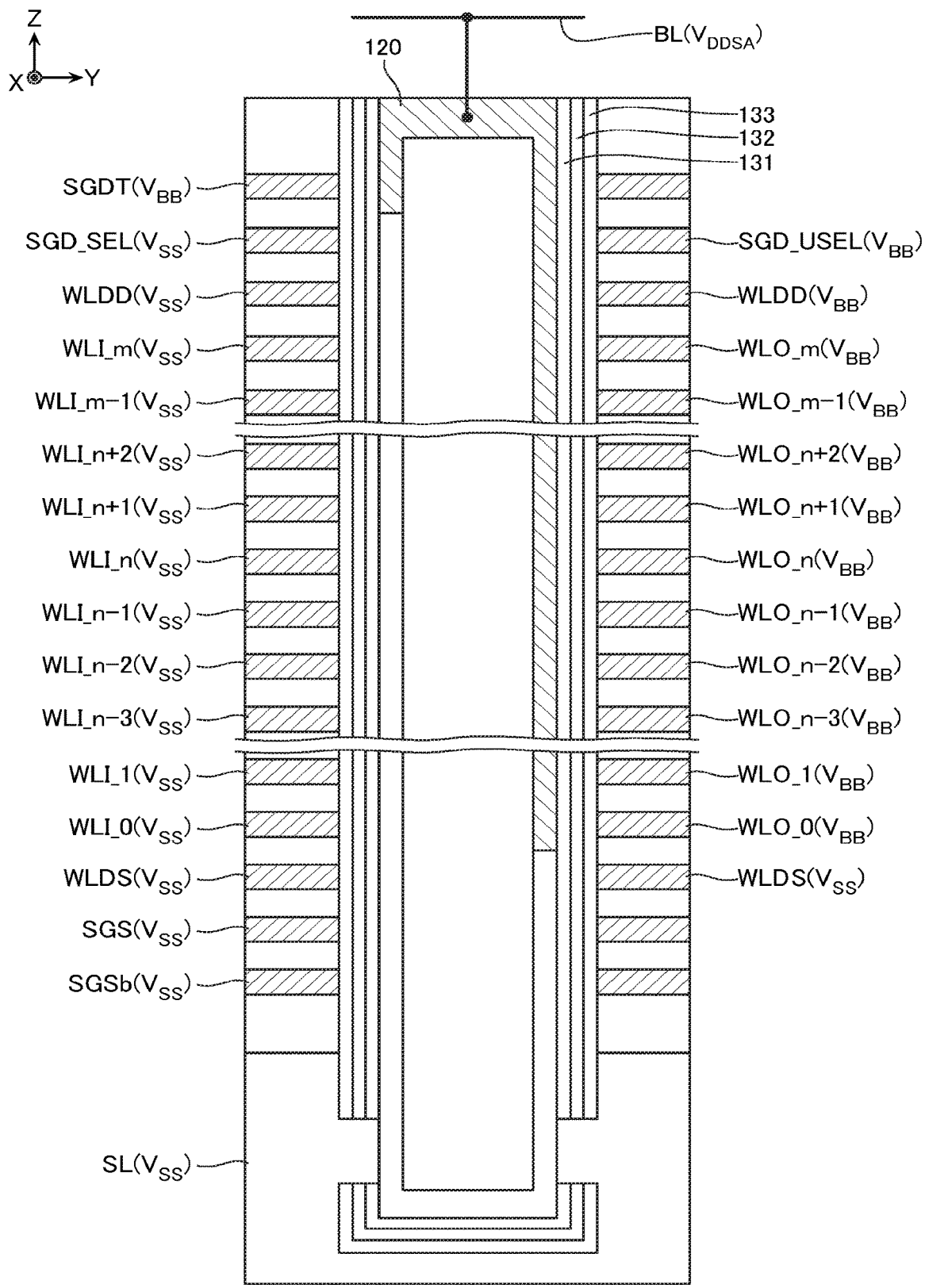
FIG. 15 is a schematic cross-sectional view for describing a hole charge operation according to a second embodiment.
Figure 16:
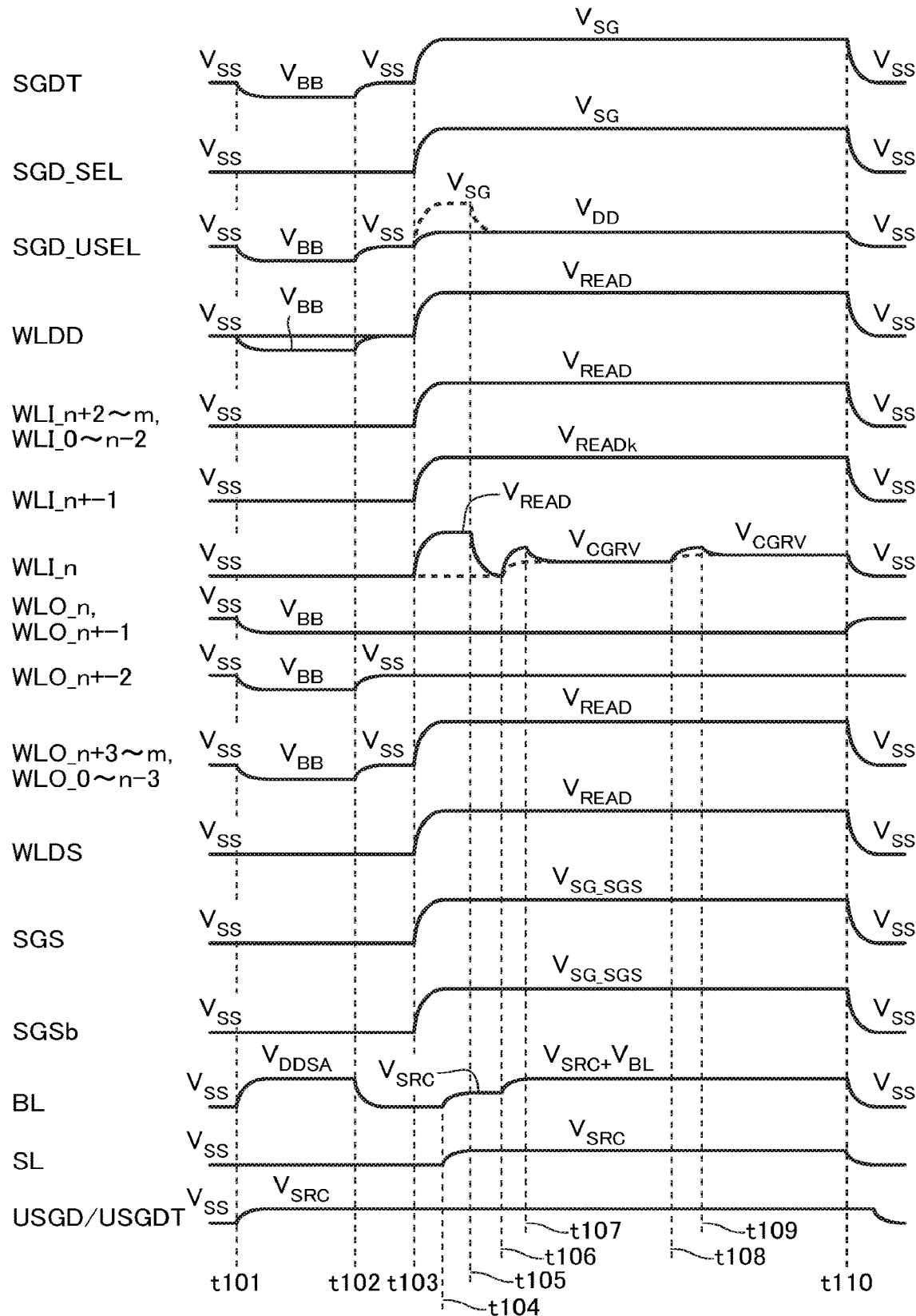
FIG. 16 is a schematic waveform diagram for describing the hole charge operation and a data read operation according to the second embodiment.

Next, with reference to FIG. 15 and FIG. 16, a semiconductor memory device according to the second embodiment will be described. FIG. 15 is a schematic cross-sectional view for describing the hole charge operation of the semiconductor memory device according to the second embodiment. FIG. 16 is a schematic waveform diagram for describing the hole charge operation and the data read operation.

As described with reference to FIG. 13 and the like, in the hole charge operation according to the first embodiment, the holes are generated in the drain-side select transistor STDT. Additionally, the read blocking voltage $V_{DD}$ is supplied to the word lines WLO_n−2 to WLO_m, the channels of the holes are formed in the channel regions of the memory cells MCO connected to them, and the holes are charged in the channel regions in the range.

However, the method is merely an example, and a specific operation is appropriately adjustable. For example, the read blocking voltage $V_{BB}$ is supplied to at least one of the word lines WLO_0 to WLO_n−3 to ensure charging the holes in a further wide range.

The hole charge operation according to the second embodiment is performed basically similarly to the hole charge operation according to the first embodiment. However, as illustrated in FIG. 15 and FIG. 16, the hole charge operation according to the second embodiment supplies the read blocking voltage $V_{BB}$ to the word lines WLO_0 to WLO_n−3, not the ground voltage $V_{SS}$.

Third Embodiment

Figure 17:
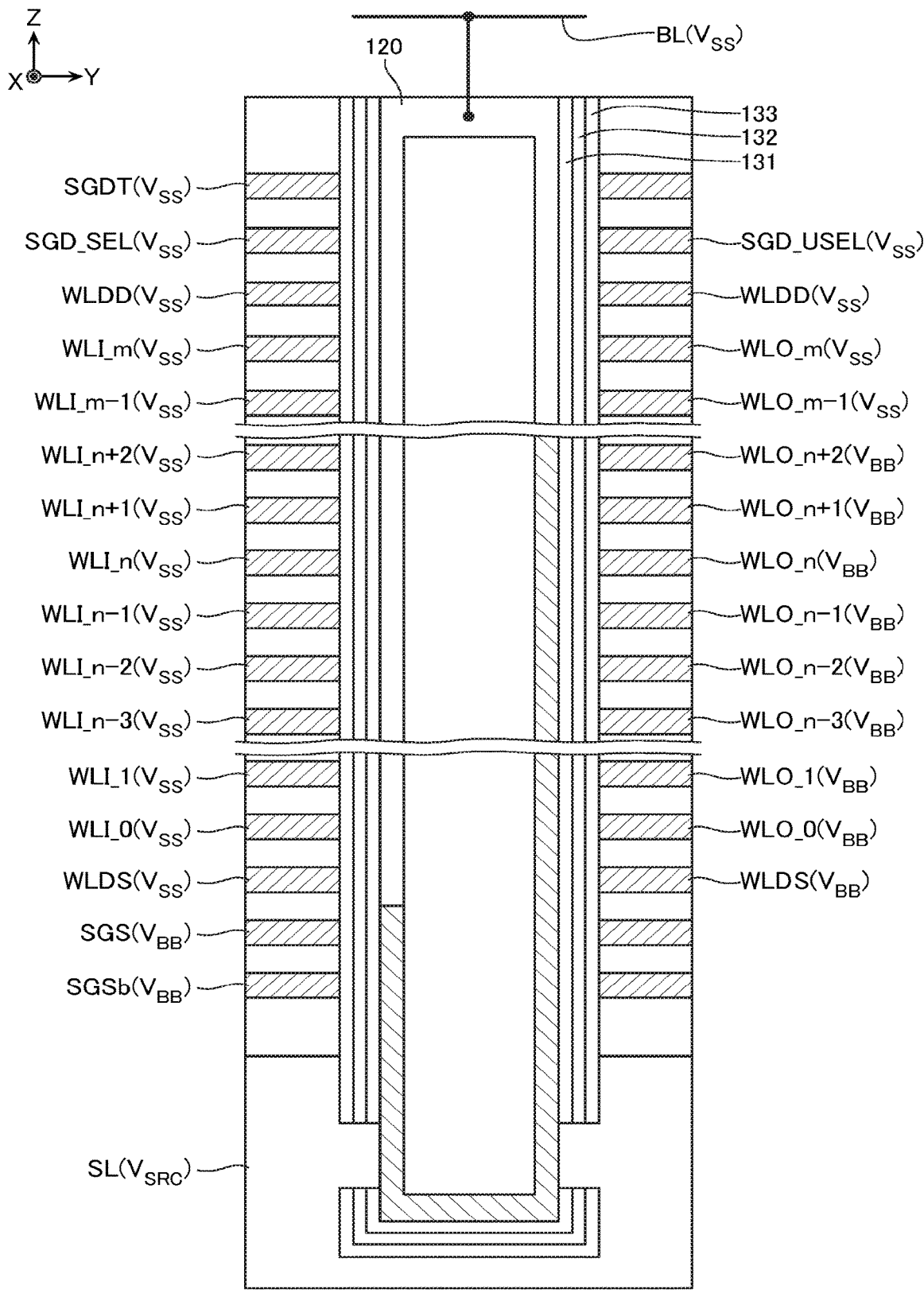
FIG. 17 is a schematic cross-sectional view for describing a hole charge operation according to a third embodiment.
Figure 18:
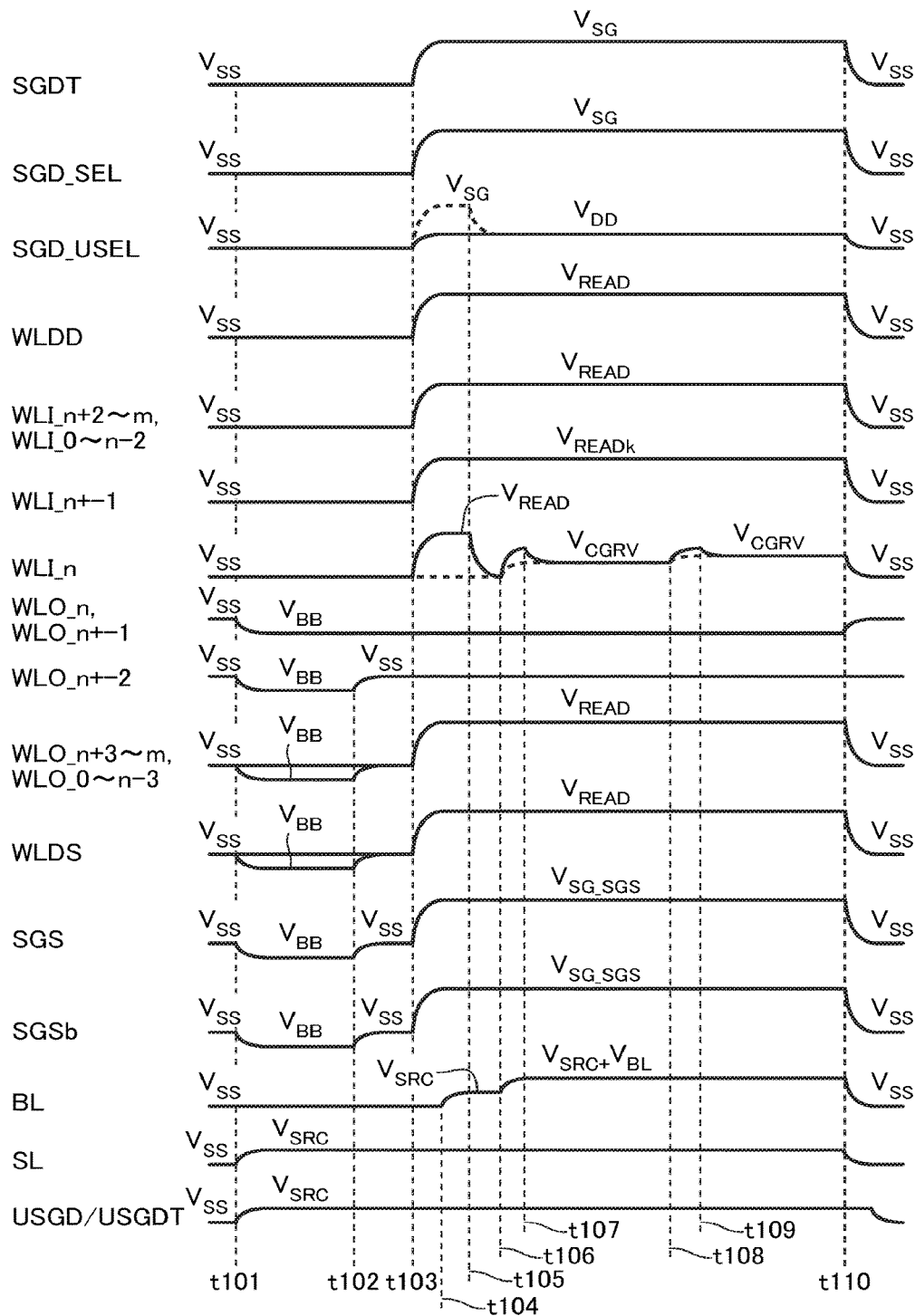
FIG. 18 is a schematic waveform diagram for describing the hole charge operation and a data read operation according to the third embodiment.

Next, with reference to FIG. 17 and FIG. 18, a semiconductor memory device according to the third embodiment will be described. FIG. 17 is a schematic cross-sectional view for describing the hole charge operation of the semiconductor memory device according to the third embodiment. FIG. 18 is a schematic waveform diagram for describing the hole charge operation and the data read operation.

As described with reference to FIG. 13 and the like, in the hole charge operation according to the first embodiment, the holes are generated in the drain-side select transistor STDT. Additionally, the read blocking voltage $V_{BB}$ is supplied to the word lines WLO_n−2 to WLO_m, the channels of the holes are formed in the channel regions of the memory cells MCO connected to them, and the holes are charged in the channel regions in the range.

However, the method is merely an example, and a specific operation is appropriately adjustable. For example, the holes can be generated not in the drain-side select transistor STDT, but the source-side select transistor STSb.

As illustrated in FIG. 17, in the hole charge operation according to the third embodiment, the ground voltage $V_{SS}$ is supplied to the bit line BL. The voltage $V_{SRC}$ is supplied to the source line SL.

The ground voltage V s is supplied to the drain-side select gate lines SGDT, SGD_SEL, and SGD_USEL. Therefore, a channel is not formed in the channel region of the drain-side select transistor STDT.

The ground voltage $V_{SS}$ is supplied to the word lines WLI_0 to WLI_m and the dummy word lines WLDD and WLDS corresponding to them. Here, a difference between the ground voltage $V_{SS}$ and the voltage $V_{SRC}$ is smaller than a threshold voltage when the memory cells MCI and the dummy memory cells MCDD and MCDS are operated as the PMOS transistors. Therefore, any channel is not formed in the channel region of the memory cell MCI or the dummy memory cell MCDD or MCDS corresponding to the selected memory string MSI.

The read blocking voltage $V_{BB}$ is supplied to the word lines WLO_0 to WLO_n+2 and the dummy word lines WLDS corresponding to them. Thus, the channels of the holes are formed in the channel regions of the memory cells MCO and the dummy memory cells MCDD connected to them.

The ground voltage $V_{SS}$ is supplied to the word lines WLO_n+3 to WLO_m and the dummy word lines WLDD corresponding to them. Therefore, channels are not formed in the channel regions of the memory cells MCO or the dummy memory cells MCDD connected to them.

The read blocking voltage $V_{BB}$ is supplied to the source-side select gate line SGS. Thus, the channel of the holes is formed in the channel region of the source-side select transistor STS.

The read blocking voltage $V_{BB}$ is supplied to the source-side select gate line SGSb. Thus, GIDL is generated in the source-side select transistor STSb, and the holes are generated in the channel region of the source-side select transistor STSb.

As illustrated in FIG. 18, at the timing t101 of the hole charge operation according to the third embodiment, the voltage described with reference to FIG. 17 is supplied to each wiring. The voltage $V_{SRC}$ is supplied to the drain-side select gate lines USGD and USGDT.

At the timing t102, the hole charge operation ends. At the timing t102, voltages of the word lines WLO_n−1 to WLO_n+1 are maintained at the read blocking voltage $V_{BB}$. The voltage of the source line SL and the voltage of the drain-side select gate lines USGD and USGDT are maintained at the voltage $V_{SRC}$. The ground voltage $V_{SS}$ is supplied to the wirings other than them.

Operations at and after the timing t103 are performed similarly to those of the first embodiment.

Fourth Embodiment

Figure 19:
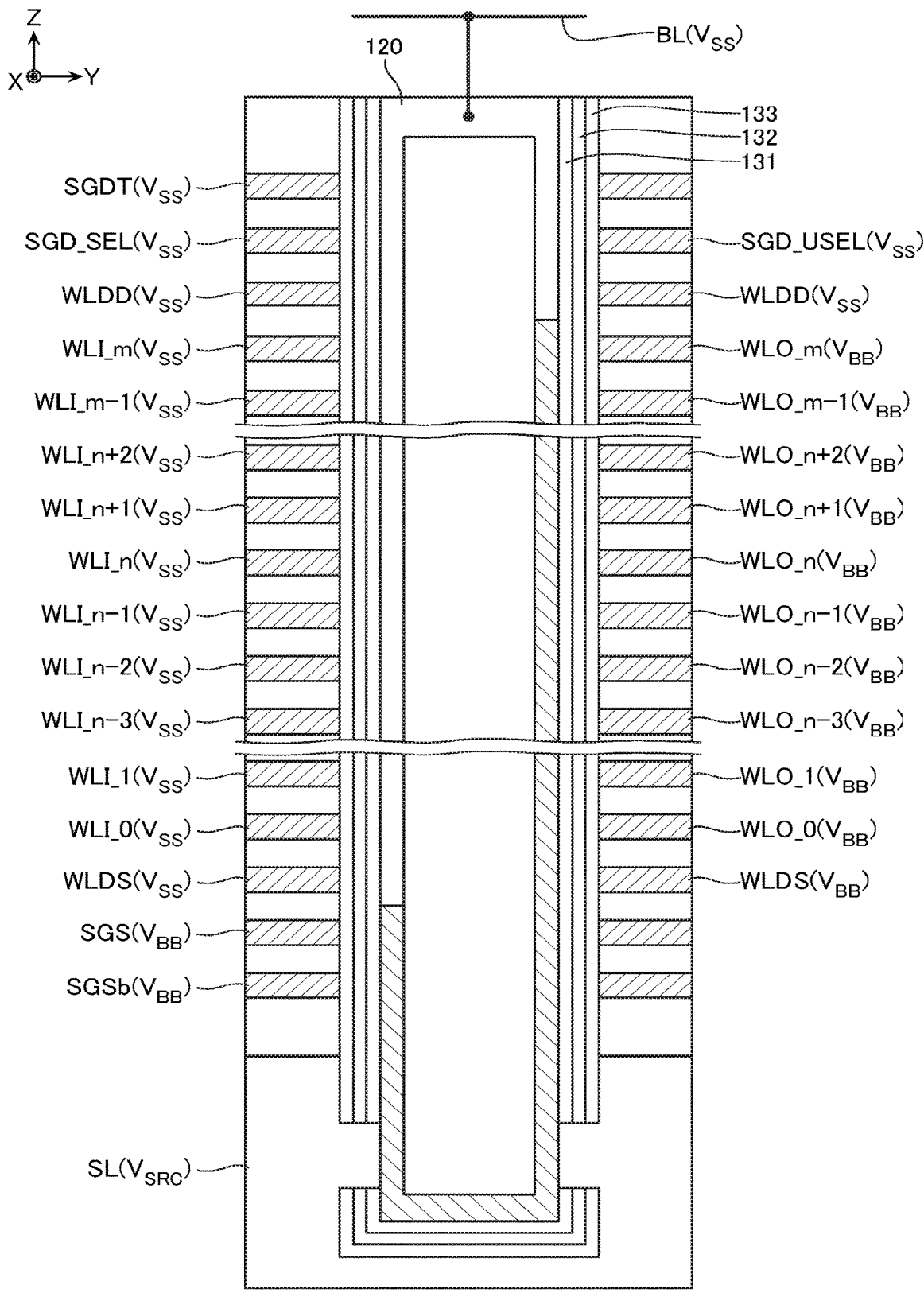
FIG. 19 is a schematic cross-sectional view for describing a hole charge operation according to a fourth embodiment.
Figure 20:
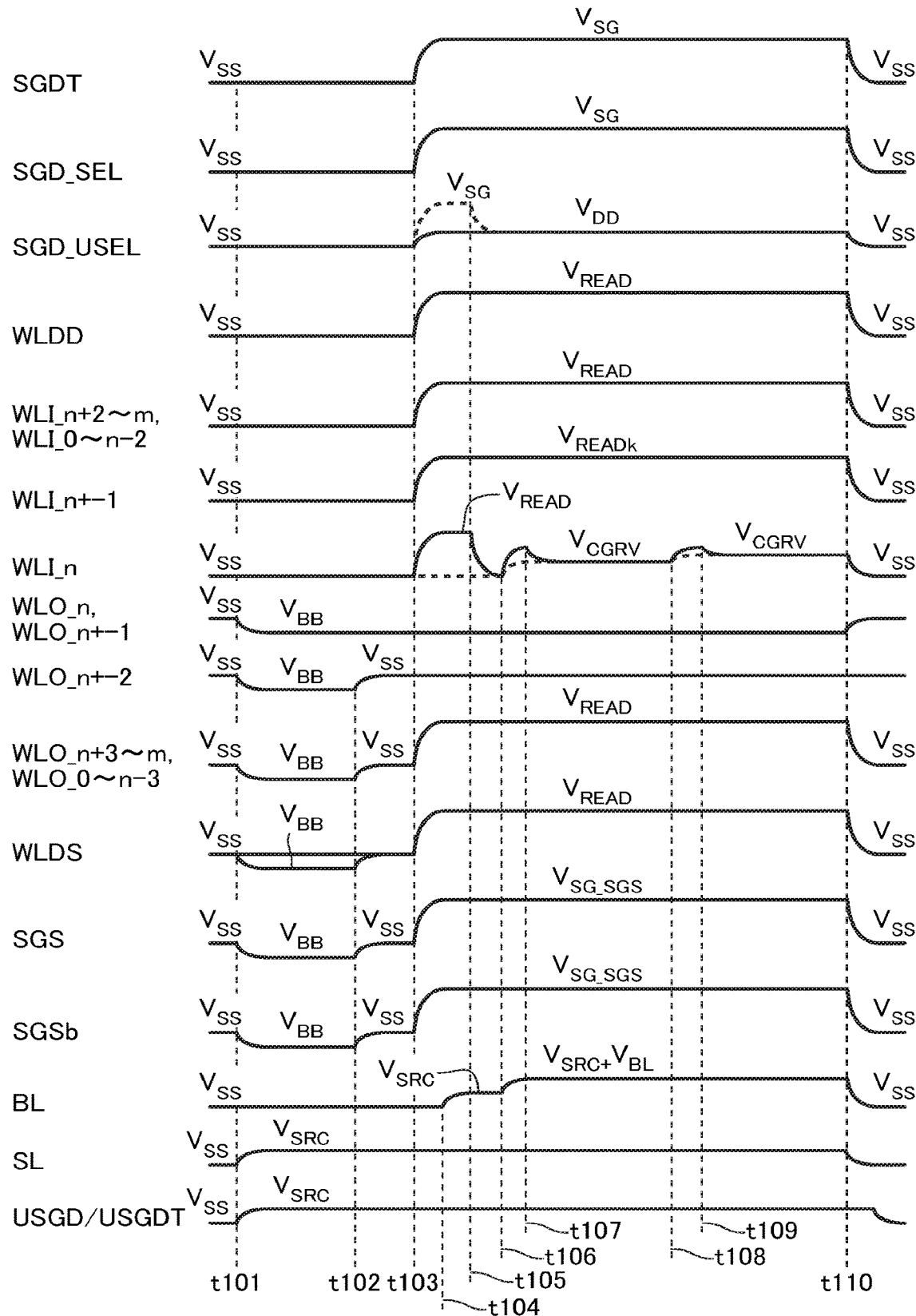
FIG. 20 is a schematic waveform diagram for describing the hole charge operation and data read operation according to the fourth embodiment.

Next, with reference to FIG. 19 and FIG. 20, a semiconductor memory device according to the fourth embodiment will be described. FIG. 19 is a schematic cross-sectional view for describing the hole charge operation of the semiconductor memory device according to the fourth embodiment. FIG. 20 is a schematic waveform diagram for describing the hole charge operation and the data read operation.

As described with reference to FIG. 17 and the like, in the hole charge operation according to the third embodiment, the holes are generated in the source-side select transistor STSb. Additionally, the read blocking voltage $V_{BB}$ is supplied to the word lines WLO_0 to WLO_n+2, the channels of the holes are formed in the channel regions of the memory cells MCO connected to them, and the holes are charged in the channel regions in the range.

However, the method is merely an example, and a specific operation is appropriately adjustable. For example, the read blocking voltage $V_{BB}$ is supplied to at least one of the word lines WLO_n+3 to WLO_m to ensure charging the holes in a further wide range.

The hole charge operation according to the fourth embodiment is performed basically similarly to the hole charge operation according to the third embodiment. However, as illustrated in FIG. 19 and FIG. 20, the hole charge operation according to the fourth embodiment supplies the read blocking voltage $V_{BB}$ to the word lines WLO_n+3 to WLO_m, not the ground voltage $V_{SS}$.

Fifth Embodiment

Figure 21:
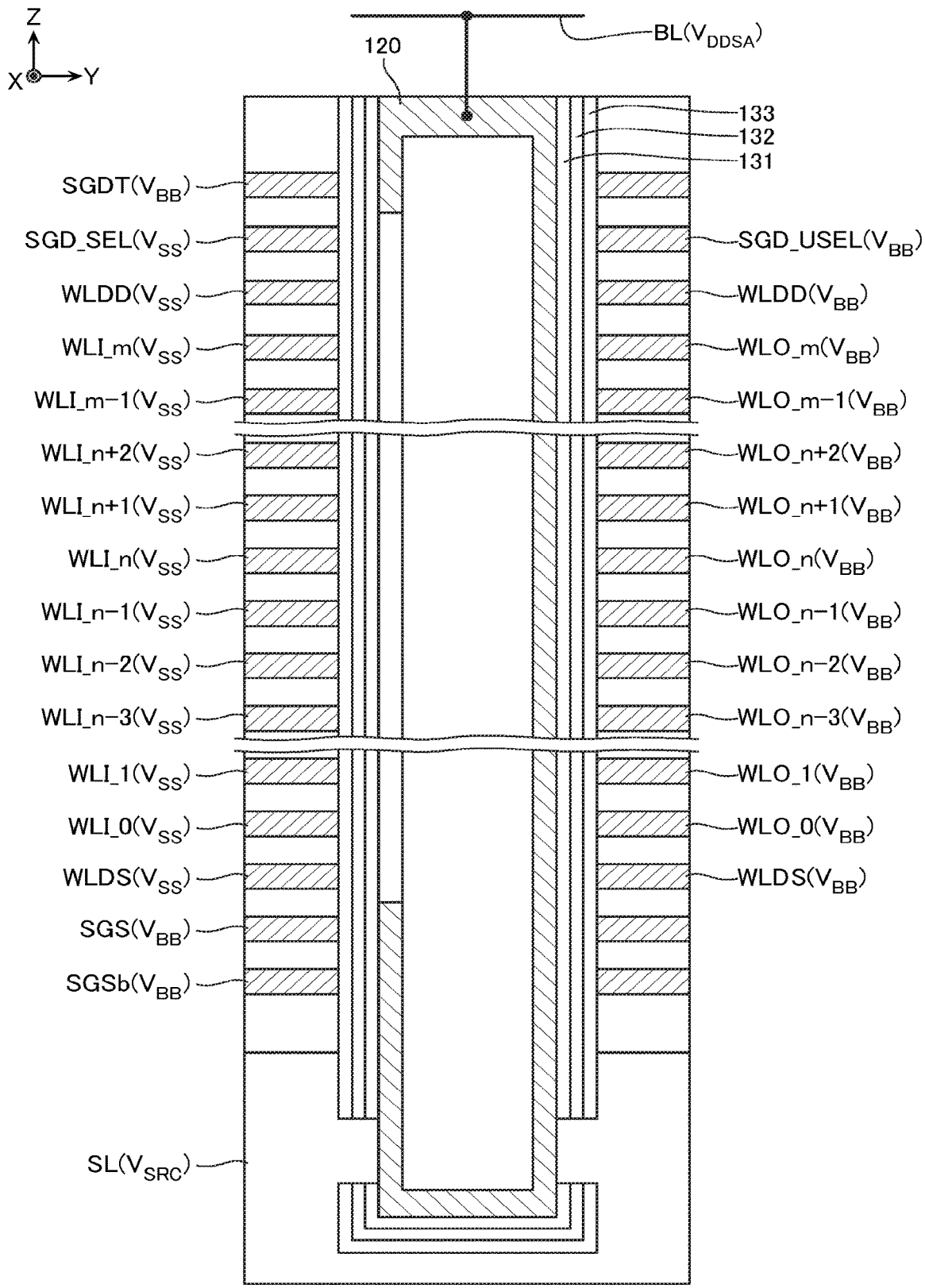
FIG. 21 is a schematic cross-sectional view for describing a hole charge operation according to a fifth embodiment.
Figure 22:
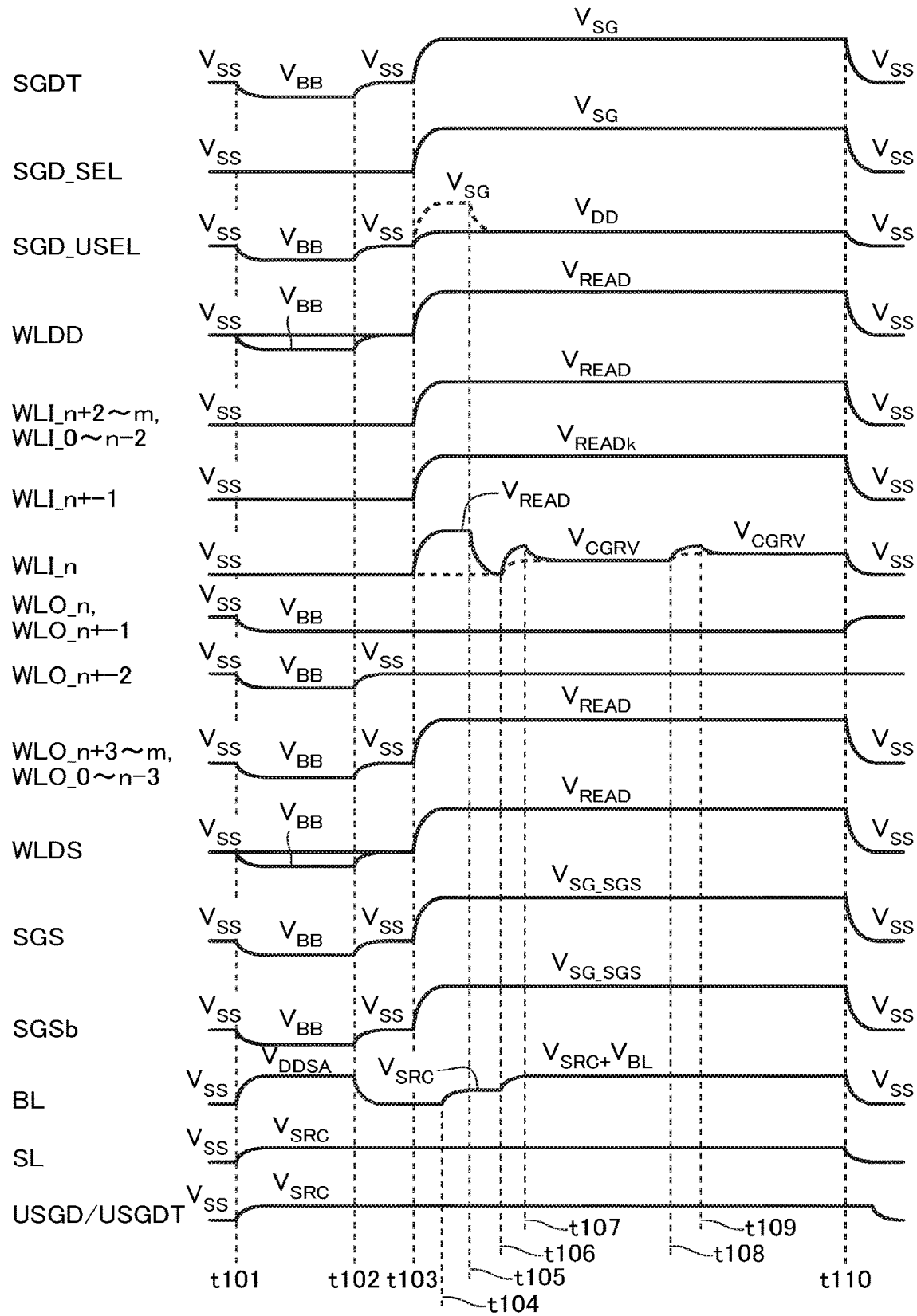
FIG. 22 is a schematic waveform diagram for describing the hole charge operation and a data read operation according to the fifth embodiment.

Next, with reference to FIG. 21 and FIG. 22, a semiconductor memory device according to the fifth embodiment will be described. FIG. 21 is a schematic cross-sectional view for describing the hole charge operation of the semiconductor memory device according to the fifth embodiment. FIG. 22 is a schematic waveform diagram for describing the hole charge operation and the data read operation.

As described with reference to FIG. 13 and the like, in the hole charge operation according to the first embodiment, the holes are generated in the drain-side select transistor STDT. As described with reference to FIG. 17 and the like, in the hole charge operation according to the third embodiment, the holes are generated in the source-side select transistor STSb.

However, the methods are merely examples, and a specific operation is appropriately adjustable. For example, the holes can be generated in both of the drain-side select transistor STDT and the source-side select transistor STSb, not in any one of them.

As illustrated in FIG. 21, in the hole charge operation according to the fifth embodiment, the voltage $V_{DDSA}$ is supplied to the bit line BL. The voltage $V_{SRC}$ is supplied to the source line SL.

The read blocking voltage $V_{BB}$ is supplied to the drain-side select gate line SGDT. Thus, a GIDL is generated in the drain-side select transistor STDT and the holes are generated in the channel region of the drain-side select transistor STDT.

The ground voltage $V_{SS}$ is supplied to the drain-side select gate line SGD_SEL. Therefore, a channel is not formed in the channel region of the drain-side select transistor STD corresponding to the selected memory string MSI.

The read blocking voltage $V_{BB}$ is supplied to the drain-side select gate line SGD_USEL. Therefore, the channels of the holes are formed in the channel regions of the drain-side select transistors STD corresponding to the unselected memory strings MSO.

The ground voltage $V_{SS}$ is supplied to the word lines WLI_0 to WLI_m and the dummy word lines WLDD and WLDS corresponding to them. Therefore, any channel is not formed in the channel region of the memory cell MCI or the dummy memory cell MCDD or MCDS corresponding to the selected memory string MSI.

The read blocking voltage $V_{BB}$ is supplied to the word lines WLO_0 to WLO_m and the dummy word lines WLDD and WLDS corresponding to them. Thus, the channels of the holes are formed in the channel regions of the memory cells MCO and the dummy memory cells MCDS and MCDD connected to them.

The read blocking voltage $V_{BB}$ is supplied to the source-side select gate line SGS. Thus, the channel of the holes is formed in the channel region of the source-side select transistor STS.

The read blocking voltage $V_{DD}$ is supplied to the source-side select gate line SGSb. Thus, GIDL is generated in the source-side select transistor STSb, and the holes are generated in the channel region of the source-side select transistor STSb.

As illustrated in FIG. 22, at the timing t101 of the hole charge operation according to the fifth embodiment, the voltage described with reference to FIG. 21 is supplied to each wiring. The voltage $V_{SRC}$ is supplied to the drain-side select gate lines USGD and USGDT.

At the timing t102, the hole charge operation ends. At the timing t102, the voltage of the word lines WLO_n−1 to WLO_n+1 is maintained at the read blocking voltage $V_{BB}$. The voltage of the source line SL and the voltage of the drain-side select gate lines USGD and USGDT are maintained at the voltage $V_{SRC}$. The ground voltage $V_{SS}$ is supplied to the wirings other than them.

Operations at and after the timing t103 are performed similarly to those of the first embodiment.

Sixth Embodiment

As described with reference to FIG. 5, the drain-side select gate line SGDT is disposed in each memory block BLK, and is connected to all of the drain-side select transistors STDT included in one memory block BLK.

In the configuration illustrated in FIG. 7 as an example, one memory block BLK includes the five drain-side select gate lines SGD configured by the conductive layers 110I and the five drain-side select gate lines SGD configured by the conductive layers 110O. Among the 10 drain-side select gate lines SGD, a voltage supplied to one drain-side select gate line SGD selected according to address data is controllable independently from the voltage supplied to the other nine drain-side select gate lines SGD. However, there may be a case where the same voltage is supplied to the nine drain-side select gate lines SGD.

Here, for example, as described with reference to FIG. 13, the hole charge operation according to the first embodiment supplies the read blocking voltage $V_{BB}$ to the drain-side select gate line SGDT, thus generating the holes in the channel region of the drain-side select transistor STDT. The read blocking voltage $V_{BB}$ is supplied to the drain-side select gate line SGD_USEL, thus forming the channel of the holes in the channel region of the drain-side select transistor STD.

Figure 23:
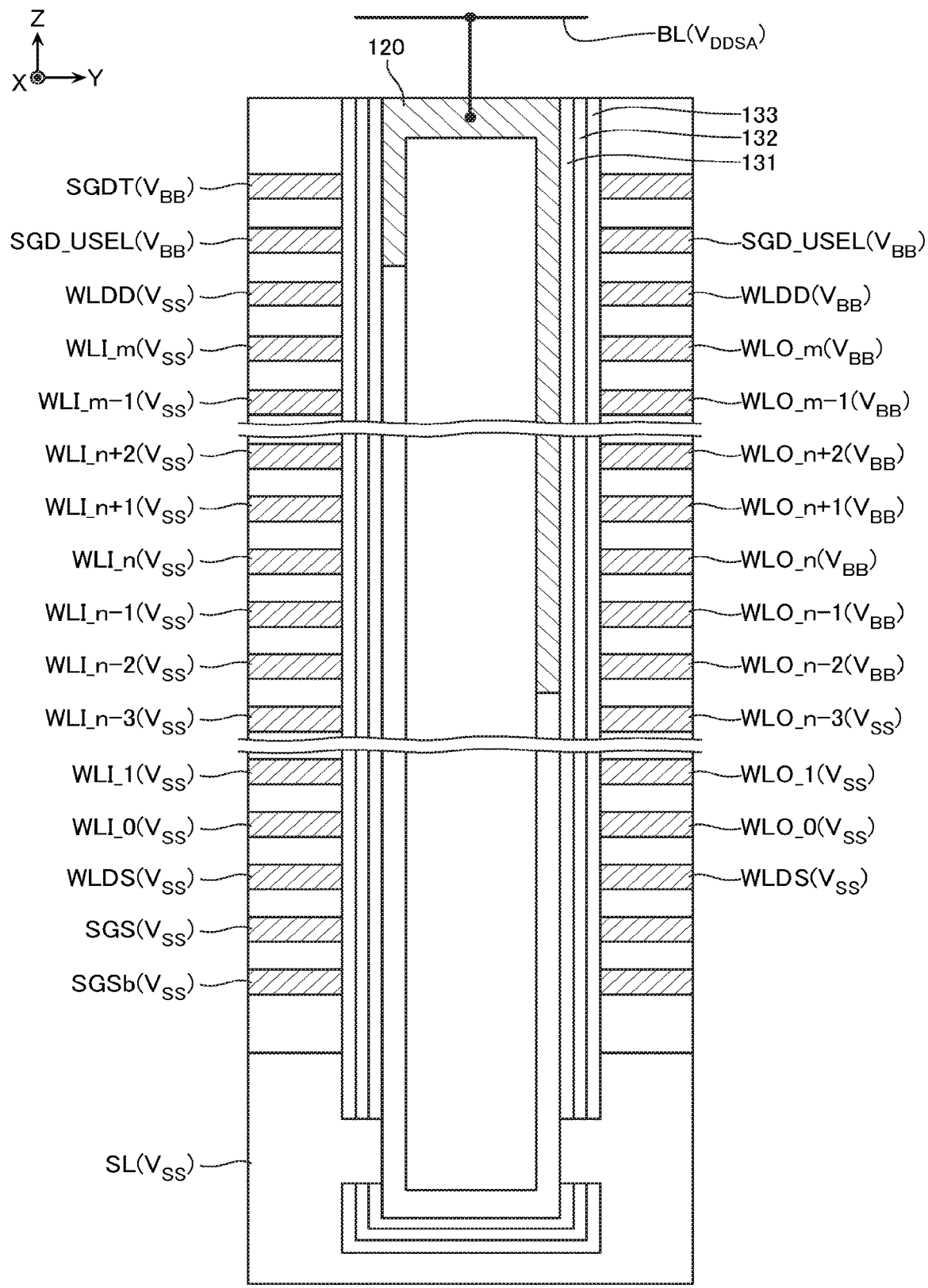
FIG. 23 is a schematic cross-sectional view for describing a hole charge operation according to a first embodiment.

When the hole charge operation is performed in the above-described configuration, for example, as illustrated in FIG. 23, the holes are also generated in the drain-side select transistors STDT included in the string units SU other than the selected string unit SU. Additionally, the channels of the holes are formed in the channel regions of the drain-side select transistors STD included in the string units SU other than the selected string unit SU, and thus the holes are charged also to the outer peripheral surfaces of the semiconductor layers 120 corresponding to the unselected string units SU.

In the sixth embodiment, a method that charges the holes to the outer peripheral surfaces of the semiconductor layers 120 included in the selected string unit SU and does not charge the holes to the outer peripheral surfaces of the semiconductor layers 120 included in the other string units SU will be exemplified.

Figure 24:
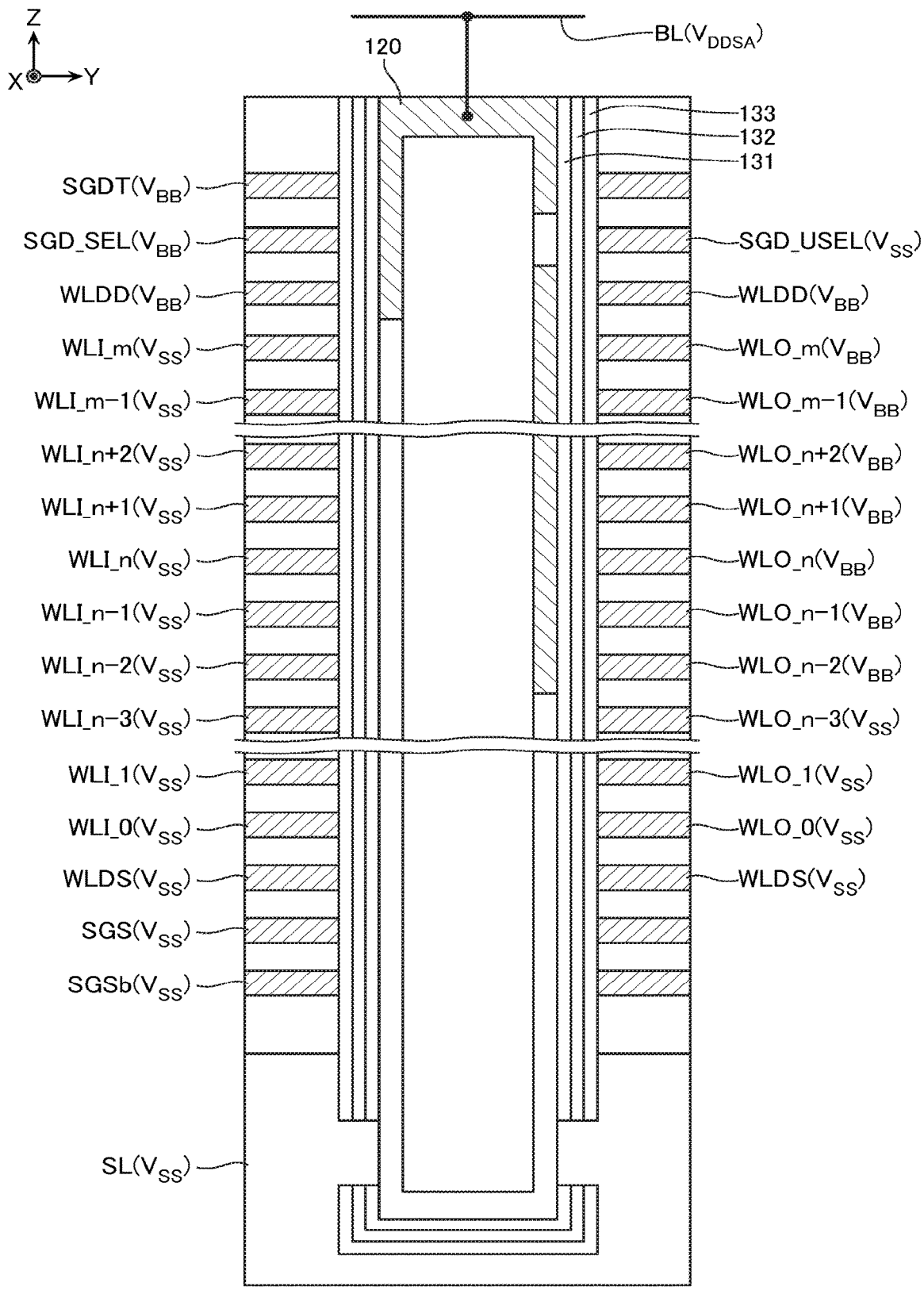
FIG. 24 is a schematic cross-sectional view for describing a hole charge operation according to a sixth embodiment.
Figure 25:
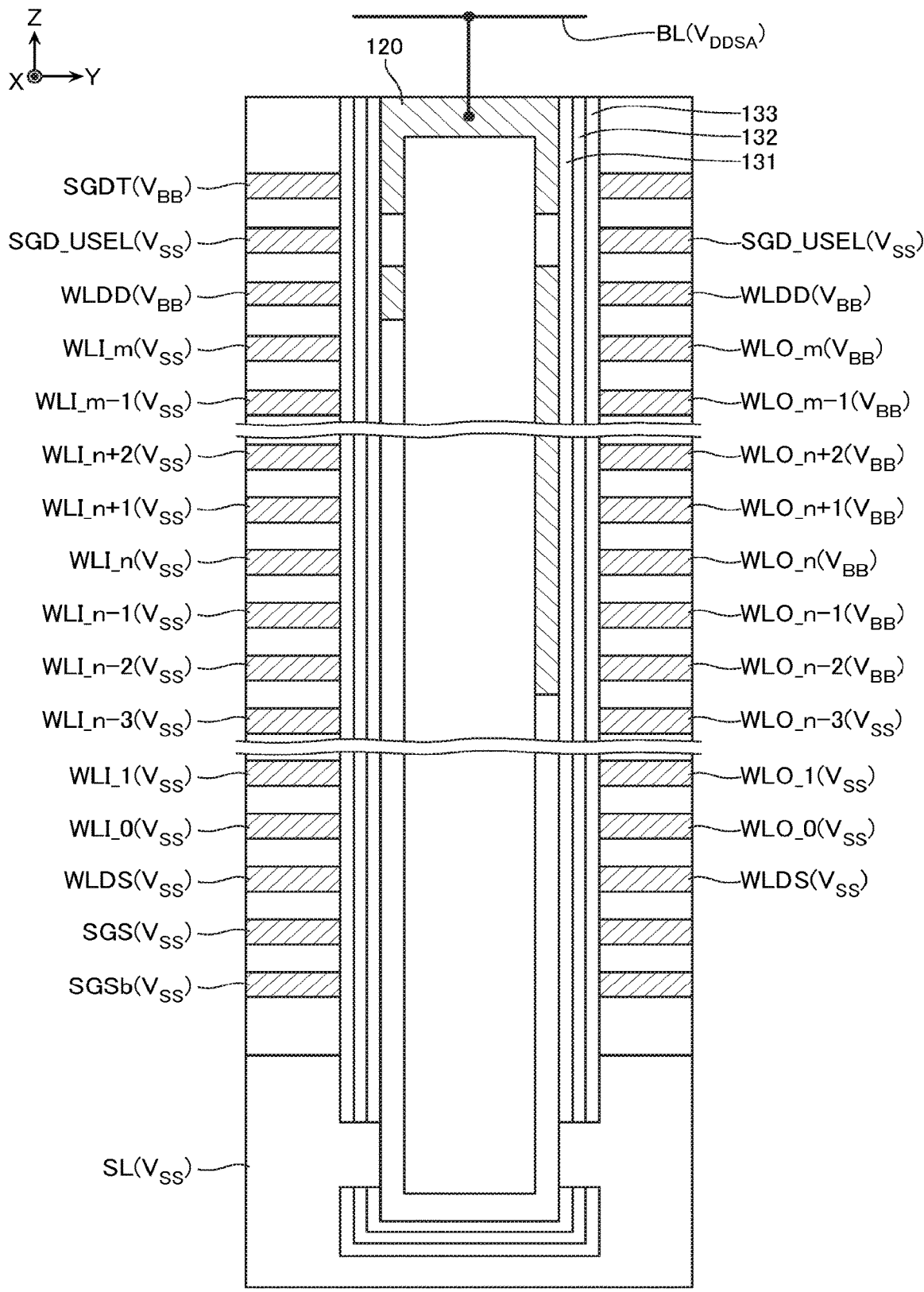
FIG. 25 is a schematic cross-sectional view for describing the hole charge operation according to the sixth embodiment.
Figure 26:
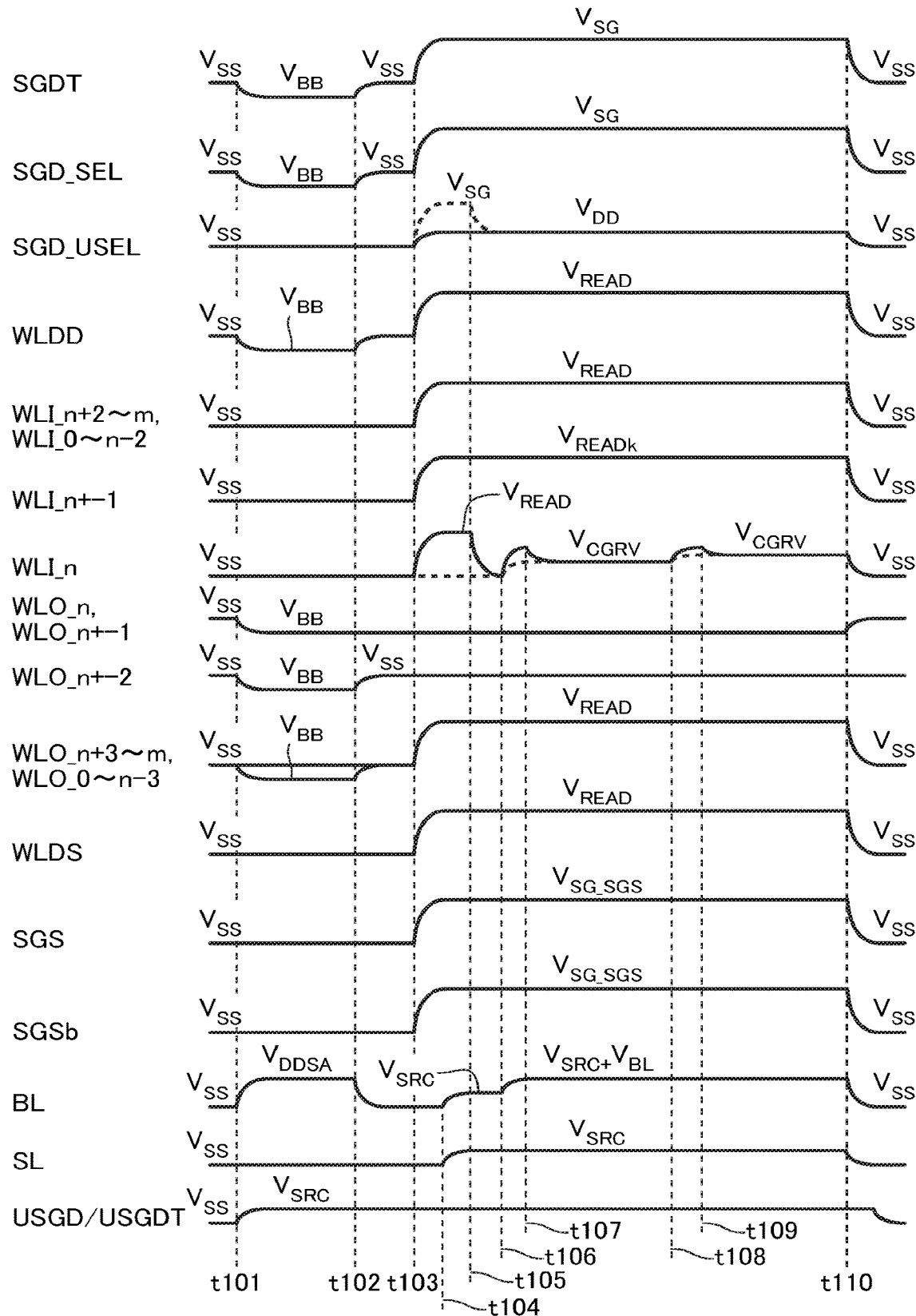
FIG. 26 is a schematic waveform diagram for describing the hole charge operation and a data read operation according to the sixth embodiment.

FIG. 24 and FIG. 25 are schematic cross-sectional views for describing the hole charge operation of the semiconductor memory device according to the sixth embodiment. FIG. 26 is a schematic waveform diagram for describing the hole charge operation and the data read operation.

The hole charge operation according to the sixth embodiment is performed basically similarly to the hole charge operation according to the first embodiment or the second embodiment. However, as illustrated in FIG. 24 to FIG. 26, in the hole charge operation according to the sixth embodiment, not the ground voltage $V_{SS}$ but the read blocking voltage $V_{BB}$ is supplied to the drain-side select gate line SGD_SEL and the dummy word line WLDD corresponding to this. The ground voltage $V_{SS}$, not the read blocking voltage $V_{BB}$, is supplied to the drain-side select gate line SGD_USEL.

For example, as illustrated in FIG. 24, the method forms the channels of the holes in the channel regions of two dummy memory cells MCDD adjacent in the Y-direction. Here, for example, as described with reference to FIG. 9 and the like, the semiconductor layer 120 according to the embodiment is formed in the approximately cylindrical shape. Therefore, for example, as illustrated in FIG. 24, when the channels of the holes are formed in the channel regions of the two dummy memory cells MCDD adjacent in the Y-direction, the two channel regions are electrically conductive with one another via side surface in the X-direction of the semiconductor layer 120. Therefore, similarly to the first embodiment or the second embodiment, the holes can be supplied to the outer peripheral surface of the semiconductor layer 120.

The method supplies the ground voltage $V_{SS}$ in the drain-side select gate line SGD_USEL and the drain-side select transistor STD connected to this is set in the OFF state. Therefore, for example, as illustrated in FIG. 25, in the unselected string unit SU, the channel regions of the drain-side select transistors STDT and the channel regions of the memory cells MCI and MCO can be electrically separated.

Accordingly, the hole charge operation according to the sixth embodiment charges the holes to the outer peripheral surfaces of the semiconductor layers 120 included in the selected string unit SU and does not charge the holes to the outer peripheral surfaces of the semiconductor layers 120 included in the other string units SU.

Seventh Embodiment

In the first embodiment to the sixth embodiment, the hole charge operation is started at the timing t101 (see FIG. 14). In this respect, the channel of the holes is formed at a part disposed near the word lines WLO_n−2 to WLO_m on the outer peripheral surface of the semiconductor layer 120. At the timing t102, the hole charge operation ends. In this respect, the channel of the holes disposed near the word lines WLO_n−1 to WLO_n+1 become electrically floating. Here, at the timing t103, the read pass voltages $V_{READ}$ and $V_{READk}$ and the like are supplied to the word lines WLI_n−1 to WLI_n+1. This possibly varies the electric potential of the channel of the holes due to capacitive coupling of the word lines WLI_n−1 to WLI_n+1.

The seventh embodiment exemplifies a method that can reduce the variation in electric potential of the channel of the holes.

Figure 27:
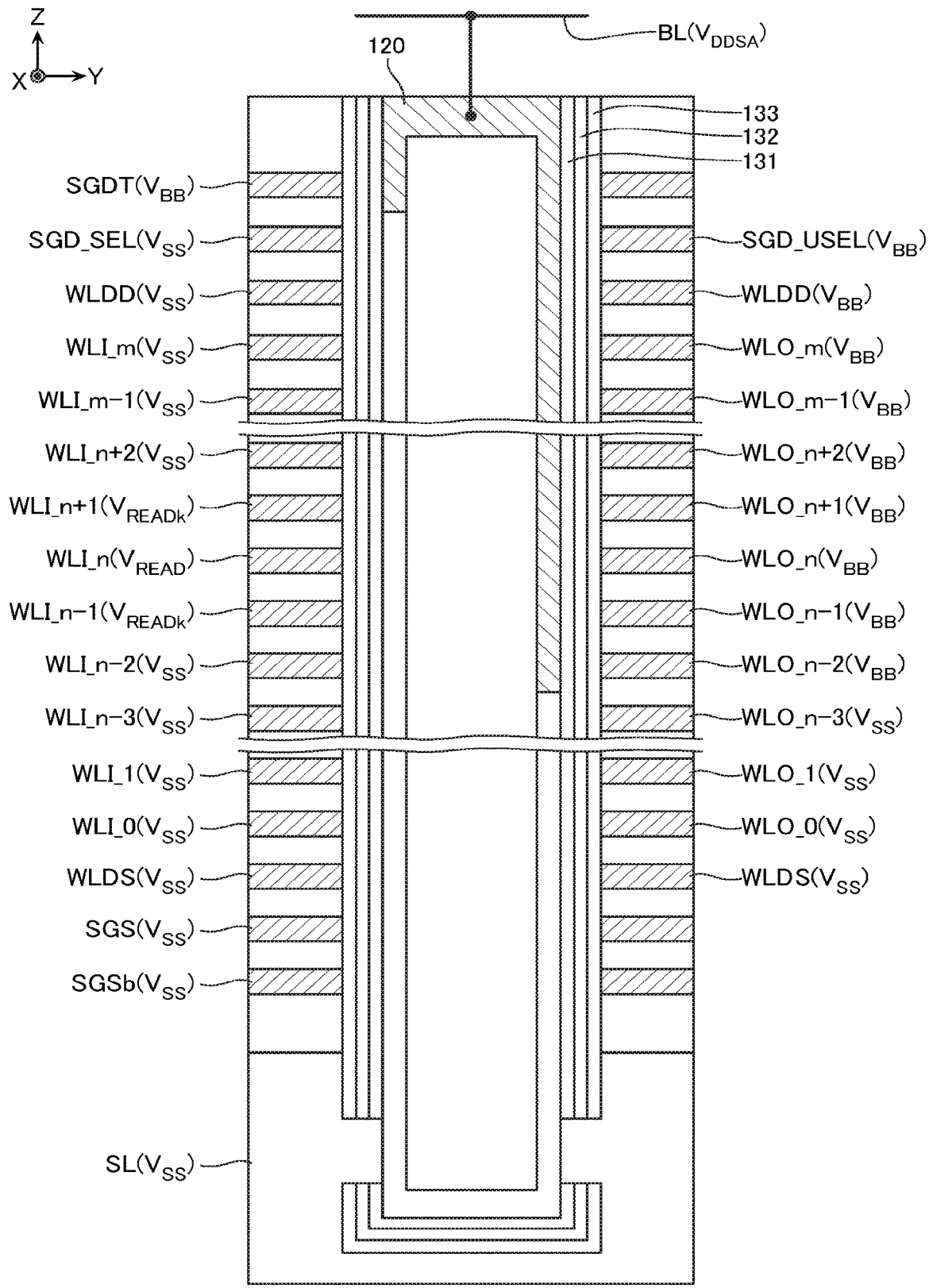
FIG. 27 is a schematic cross-sectional view for describing a hole charge operation according to a seventh embodiment.
Figure 28:
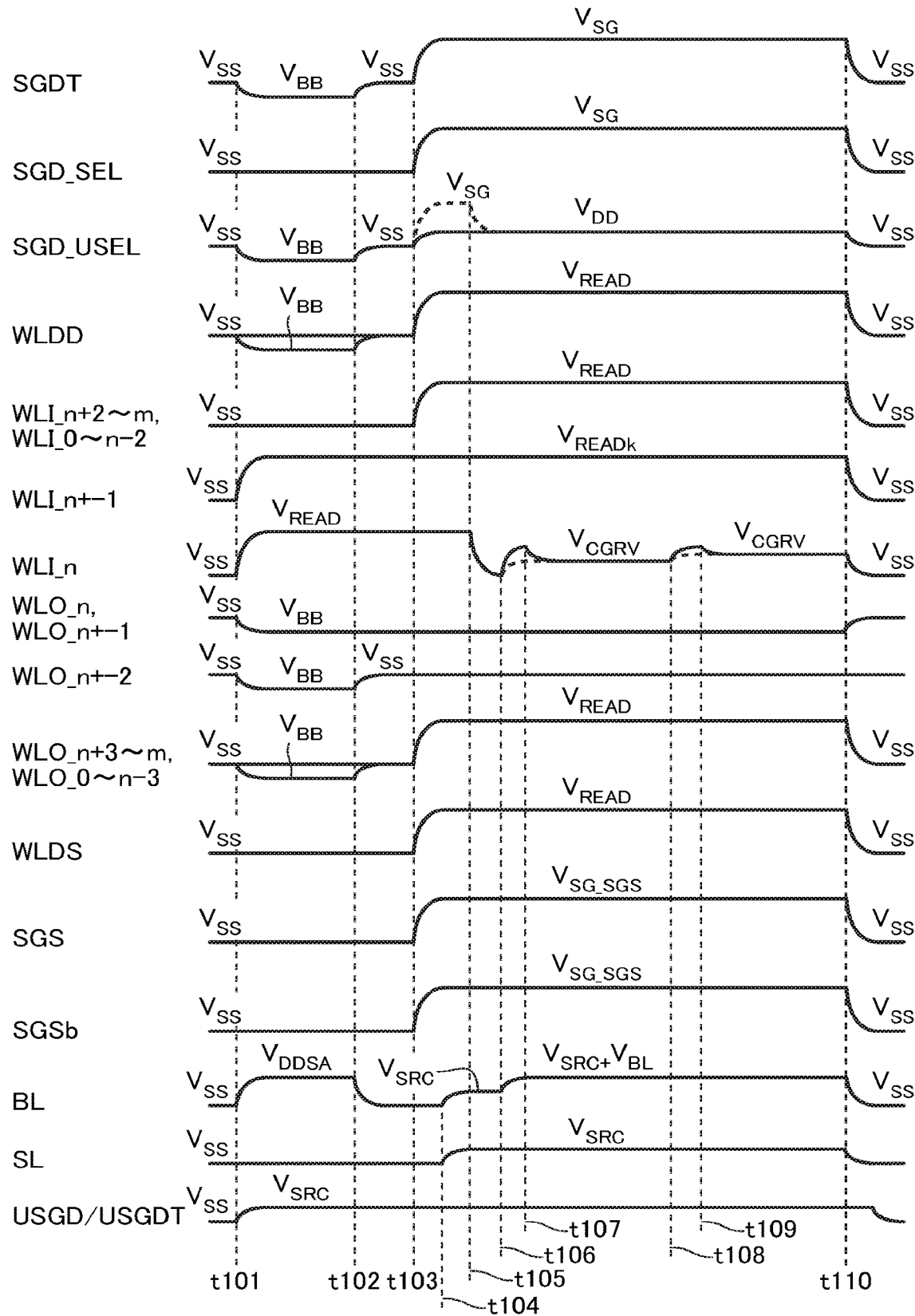
FIG. 28 is a schematic waveform diagram for describing the hole charge operation and a data read operation according to the seventh embodiment.

FIG. 27 is a schematic cross-sectional view for describing the hole charge operation of the semiconductor memory device according to the seventh embodiment. FIG. 28 is a schematic waveform diagram for describing the hole charge operation and the data read operation.

The hole charge operation according to the seventh embodiment is performed basically similarly to the hole charge operation according to any one of the first embodiment to the sixth embodiment. However, as illustrated in FIG. 27 and FIG. 28, in the hole charge operation according to the seventh embodiment, the read pass voltage $V_{READ}$ is supplied to the selected word line WLI_n. The read pass voltage $V_{READk}$ is supplied to the word lines WLI_n−1 and WLI_n+1. The voltage supplied to the selected word line WLI_n is maintained at the read pass voltage $V_{READ}$ from the timing t101 to the timing t105. The voltages supplied to the word lines WLI_n−1 and WLI_n+1 are maintained at the read pass voltage $V_{READk}$ from the timing t101 to the timing t110.

The method maintains the voltage of the word lines WLI_n−1 and WLI_n+1 at a fixed magnitude in a period at and after the timing t102 at which the channel of the holes enters the floating state. Therefore, the variation in the electric potential of the channel of the holes can be reduced.

Note that the voltages of the word lines WLI_n−1 and WLI_n+1 are preferably maintained at the read pass voltage $V_{READk}$ at least until a timing when all of the sense operations included in the data read operation end.

Eighth Embodiment

In the first embodiment to the seventh embodiment, as one aspect of the read operation, the data read operation is exemplified. Additionally, the examples in which the hole charge operation is performed before performing the data read operation has been described. However, the semiconductor memory device performs other read operations in addition to the data read operation in some cases. For example, the hole charge operation according to the first embodiment to the seventh embodiment can be performed before performing the read operation other than the data read operation.

For example, in a write operation of the semiconductor memory device, a program operation and a verify operation are repeatedly performed in some cases. The program operation is an operation that supplies a program voltage $V_{PGM}$ to the selected word lines WLI or WLO and accumulates the electrons on the charge storage film 132 to increase threshold voltages of the memory cells MCI or MCO. Note that the program voltage $V_{PGM}$ is larger than the above-described read pass voltage $V_{READ}$. The verify operation is one aspect of the read operation. The verify operation is an operation that senses whether the threshold voltages of the memory cells MCI or MCO increase up to a desired magnitude or not. In the case, the hole charge operation can be performed, for example, after performing the program operation and before the verify operation is performed.

For example, in an erase operation of the semiconductor memory device, an erase voltage supply operation and an erase verify operation are repeatedly performed in some cases. The erase voltage supply operation is an operation that supplies the ground voltage $V_{SS}$ to the word lines WLI and WLO, supplies the erase voltage to at least one of the bit line BL and the source line SL to accumulate the holes on the charge storage film 132, thus reducing the threshold voltages of the memory cells MCI and MCO. Note that the erase voltage is larger than the above-described read pass voltage $V_{READ}$. The erase verify operation is one aspect of the read operation. The erase verify operation is an operation that senses whether the threshold voltages of the memory cells MCI and MCO decrease down to a desired magnitude or not. In the case, the hole charge operation can be performed, for example, after performing the erase voltage supply operation and before the erase verify operation is performed.

Figure 29:
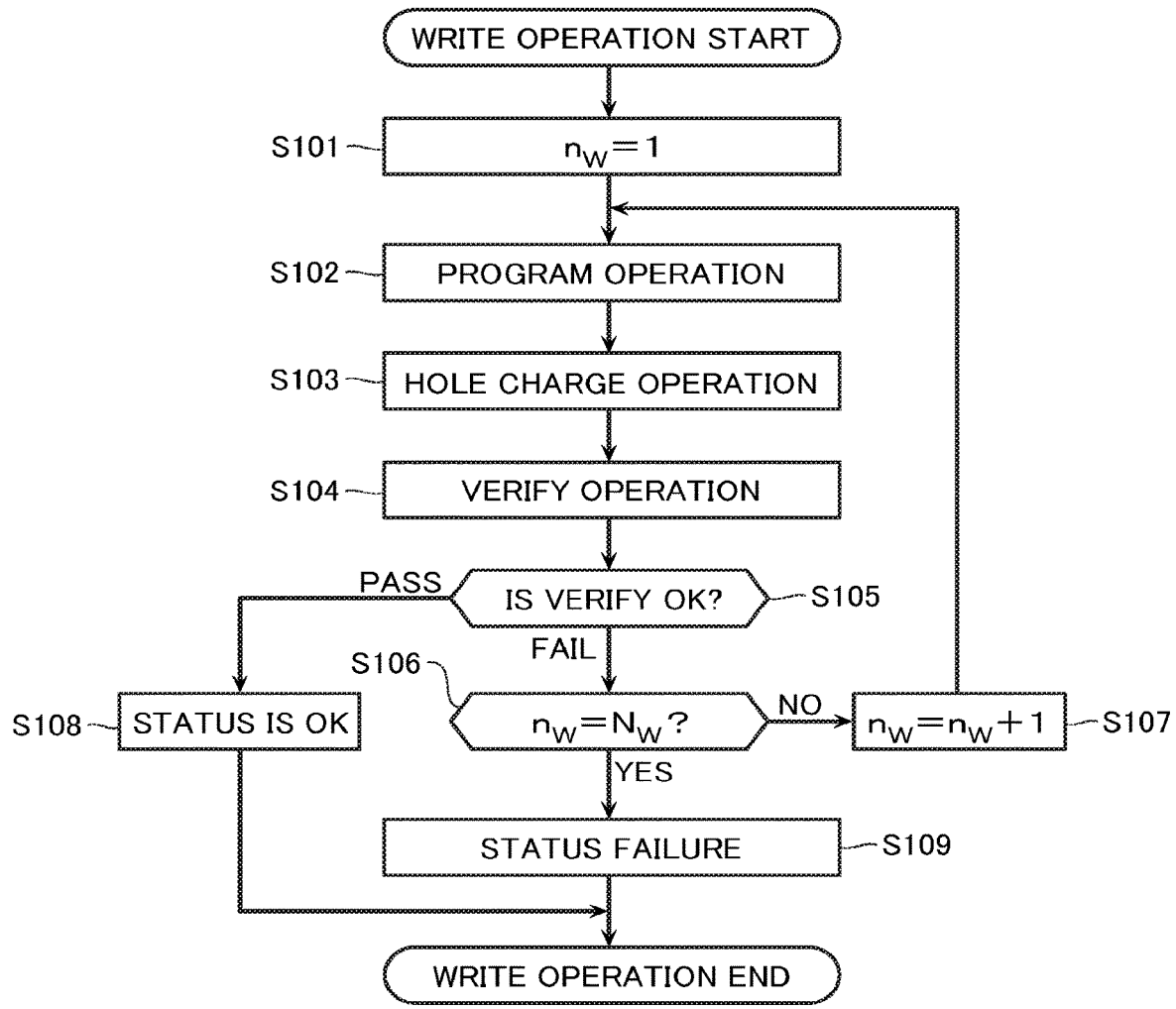
FIG. 29 is a schematic flowchart for describing a write operation according to an eighth embodiment.
Figure 30:
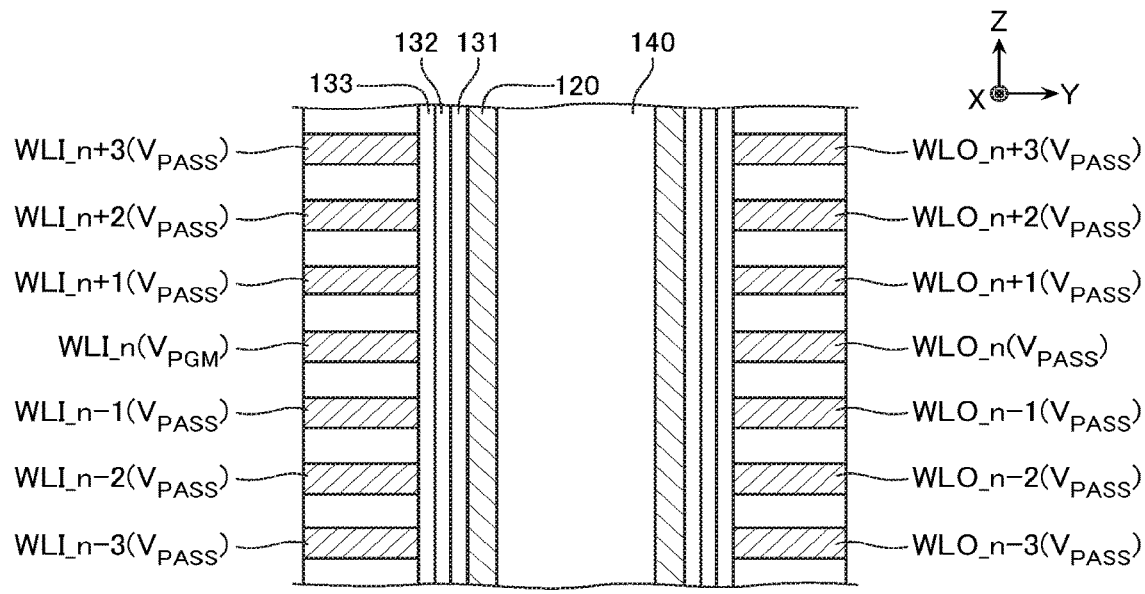
FIG. 30 is a schematic cross-sectional view for describing the write operation.
Figure 31:
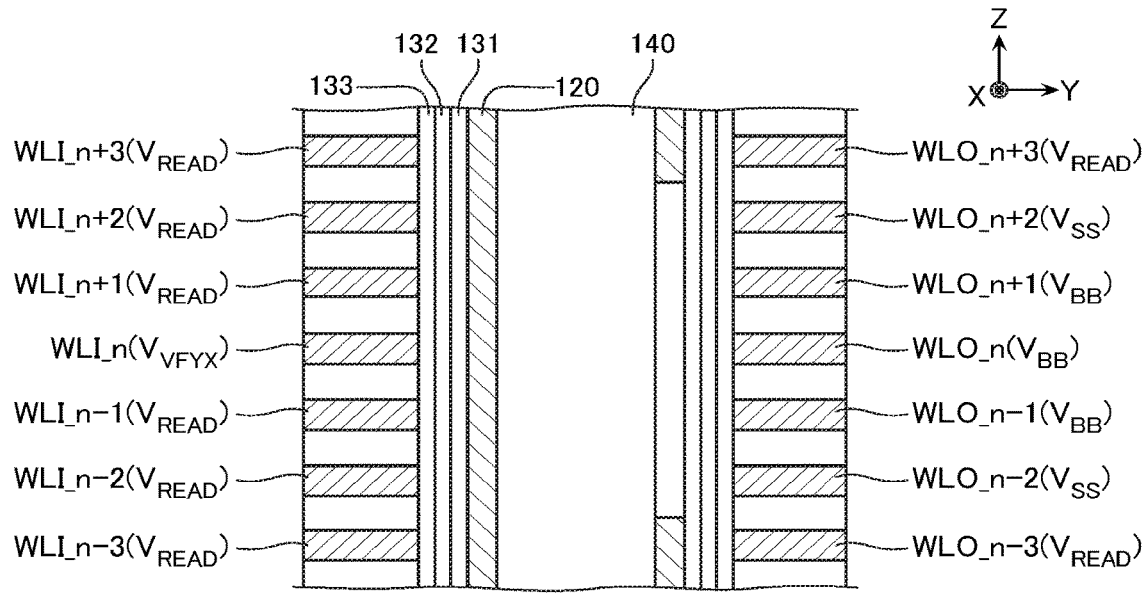
FIG. 31 is a schematic cross-sectional view for describing the write operation.

Hereinafter, with reference to FIG. 29 to FIG. 31, a method for the write operation will be exemplified. FIG. 29 is a schematic flowchart for describing the write operation of a semiconductor memory device according to an eighth embodiment. FIG. 30 and FIG. 31 are schematic cross-sectional views for describing the write operation. Note that the write operation according to the embodiment is performed on all of the memory cells MCI or MCO included in the designated page. FIG. 30 and FIG. 31 describe an example of performing the write operation on the page corresponding to the memory string MSI.

In Step S101 (FIG. 29), a loop count $n_W$ is set to 1. The loop count $n_W$ is stored in a register or the like.

In Step S102, the program operation is performed.

In the program operation, for example, the voltage $V_{SRC}$ is supplied to bit lines BL (FIG. 5) connected to a plurality of selected memory cells MCI and MCO threshold voltages of which are adjusted, and the voltage $V_{DD}$ is supplied to bit lines BL connected to a plurality of selected memory cells MCI and MCO threshold voltages of which are not adjusted.

As illustrated in FIG. 30, the program voltage $V_{PGM}$ is supplied to the conductive layer 110I that functions as the selected word line WLI and the write pass voltage $V_{PASS}$ is supplied to the conductive layers 110I and 110O that function as the non-selected word lines WLI and WLO.

The program voltage $V_{PGM}$ is a voltage to the extent that the electrons are accumulated in the charge storage film 132 of the selected memory cells MCI and MCO and is larger than the above-described read pass voltage $V_{READ}$. The write pass voltage $V_{PASS}$ is a voltage to the extent that the memory cells MCI and MCO enter the ON state regardless of the data stored in the memory cells MCI and MCO, is same as or larger than the above-described read pass voltage $V_{READ}$, and smaller than the program voltage $V_{PGM}$.

Thus, the electron channel to electrically conduct the bit line BL and the channel regions of the selected memory cells MCI and MCO is formed in the semiconductor layer 120. The electrons in the channel regions of the selected memory cells MCI and MCO tunnel through the tunnel insulating layer 131 and are accumulated in the charge storage film 132.

In Step S103 (FIG. 29), the hole charge operation is performed. The hole charge operation performed in Step S103 may be the hole charge operation according to any of the first embodiment to the seventh embodiment.

In Step S104 (FIG. 29), the verify operation is performed.

The verify operation is performed basically similarly to the data read operation. However, for example, as illustrated in FIG. 31 as an example, in the verify operation, a verify voltage $V_{VFYX}$, not the read voltage $V_{CGRV}$, is supplied to the conductive layer 110I that functions as the selected word line WLI. The verify voltage $V_{VFYX}$ is, for example, any of the verify voltages $V_{VFYA}$, $V_{VFYB}$ . . . , which have been described with reference to FIG. 11.

In Step S105 (FIG. 29), the result of the verify operation is determined. For example, when a proportion of the selected memory cells MCI or MCO detected as being in the ON state in the verify operation is equal to or more than a predetermined value or more, it is determined as verify FAIL, and the process proceeds to Step S106. On the other hand, when the proportion of the memory cells MCI or MCO detected as being in the ON state is less than the predetermined value in the verify operation, it is determined as verify PASS, and the process proceeds to Step S108.

In Step S106, whether the loop count $n_W$ has reached a predetermined count $N_W$ or not is determined. When the predetermined count $N_W$ is not reached, the process proceeds to Step S107. When the predetermined count $N_W$ is reached, the process proceeds to Step S109.

In Step S107, 1 is added to the loop count $n_W$, and the process proceeds to Step S102. In Step S107, for example, a predetermined voltage $\Delta V$ is added to the program voltage $V_{PGM}$.

In Step S108, status data indicative of normal termination of the write operation is stored in a status register (not illustrated) and the write operation ends.

In Step S109, status data indicating that the write operation has not normally completed is stored in the status register (not illustrated) and the write operation ends.

OTHER EMBODIMENTS

The semiconductor memory devices and control methods thereof according to the first embodiment to the eighth embodiment have been exemplified above. However, the above-described aspects are merely examples, and specific aspects and the like are appropriately adjustable.

For example, the configurations that have been described with reference to FIG. 1 to FIG. 10 are merely examples, and specific configurations are appropriately adjustable.

For example, in the configuration exemplified in FIG. 5, the example in which one dummy memory cell MCDD is disposed between the drain-side select transistor STD and the memory cells MCI or MCO has been described. Additionally, the example in which one dummy memory cell MCDS is disposed between the source-side select transistor STS and the memory cells MCI or MCO has been described. However, the dummy memory cells MCDD and MCDS may be omitted or a plurality of them may be disposed. In the case, the numbers of conductive layers 110I and 110O (FIG. 9) stacked in the Z-direction are appropriately adjustable.

For example, in the configuration illustrated in FIG. 5 as an example, the drain-side select transistor STDT and the drain-side select transistor STD are disposed separately. Additionally, the source-side select transistor STS and the source-side select transistor STSb are disposed separately. However, the drain-side select transistor STDT may be omitted, and a part of the function of the drain-side select transistor STDT may be achieved by the drain-side select transistor STD. Alternatively, the source-side select transistor STSb may be omitted, and a part of the function of the source-side select transistor STSb may be achieved by the source-side select transistor STS. In the case, the numbers of conductive layers 110I and 110O (FIG. 9) stacked in the Z-direction are appropriately adjustable.

For example, in the configuration illustrated in FIG. 7 as an example, one memory block BLK includes the five drain-side select gate lines SGD configured by the conductive layers 110I and the five drain-side select gate lines SGD configured by the conductive layers 110O. However, the number of the drain-side select gate lines SGD disposed in one memory block BLK may be larger than 10 or may be less than 10.

For example, in the configuration illustrated in FIG. 9 as an example, the semiconductor layer 120 is configured to have the approximately cylindrical shape. However, for example, the semiconductor layer 120 may include an approximately flat plate-shaped part opposed to the side surfaces of the conductive layers 110I and an approximately flat plate-shaped part opposed to the side surfaces of the conductive layers 110O.

For example, in the configuration illustrated in FIG. 9 as an example, the semiconductor layer 121 contains n-type impurities, such as phosphorus (P), and the lower end of the semiconductor layer 120 is connected to the semiconductor layer 121. However, the semiconductor layer 121 may contain p-type impurities, such as boron (B), and the lower end of the semiconductor layer 120 may be connected to the semiconductor layer 121. To perform the hole charge operation according to any of the third embodiment to the fifth embodiment in the configuration, GIDL is not generated in the source-side select transistor STSb, but the semiconductor layer 120 may be charged with the holes in the semiconductor layer 121. Note that the operations according to the seventh embodiment and the eighth embodiment can be performed in combination with the operation.

For example, the operations described with reference to FIG. 12 to FIG. 31 are merely examples, and the specific method is appropriately adjustable.

For example, the hole charge operation according to the first embodiment (FIG. 13), the second embodiment (FIG. 15), or the fifth embodiment (FIG. 21) supplies the ground voltage $V_{SS}$ to the drain-side select gate line SGD_SEL and supplies the read blocking voltage $V_{BB}$ to the drain-side select gate line SGD_USEL. However, for example, the read blocking voltage $V_{BB}$ may be supplied to both of the drain-side select gate lines SGD_SEL and SGD_USEL. Note that the operations according to the seventh embodiment and the eighth embodiment can be performed in combination with the operation.

For example, the data read operation according to the first embodiment to the seventh embodiment supplies the read pass voltage $V_{READk}$ to the word lines WLI_n−1 and WLI_n+1. However, the read pass voltage $V_{READ}$ may be supplied to the word lines WLI_n−1 and WLI_n+1.

[Command Set]

In the first embodiment to the seventh embodiment, when the command set indicating performing the data read operation is input from the controller die CD to the memory die MD, both of the hole charge operation and the data read operation may be performed in response to the input of the command set. In the case, for example, an operation parameter that indicates whether to perform the hole charge operation in the data read operation or not may be provided. In the first embodiment to the seventh embodiment, the command set indicating performing the hole charge operation and the command set indicating performing the data read operation may be different command sets.

In the eighth embodiment, when the command set indicating performing the write operation or the like is input from the controller die CD to the memory die MD, both of the hole charge operation and the write operation or the like may be performed in response to the input of the command set. Similarly, when the command set indicating performing the erase operation or the like is input from the controller die CD to the memory die MD is input, both of the hole charge operation and the erase operation or the like may be performed in response to the input of the command set. In the case, for example, an operation parameter of the semiconductor memory device indicative of whether to perform the hole charge operation when at least one of the write operation and the erase operation is performed or not may be provided.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a plurality of first conductive layers arranged in a first direction;
    a plurality of second conductive layers spaced from the plurality of first conductive layers in a second direction intersecting with the first direction, the plurality of second conductive layers being arranged in the first direction;
    a first semiconductor layer disposed between the plurality of first conductive layers and the plurality of second conductive layers, the first semiconductor layer extending in the first direction and being opposed to the plurality of first conductive layers and the plurality of second conductive layers;
    a charge storage layer that includes a first part and a second part, the first part being disposed between the plurality of first conductive layers and the first semiconductor layer, the second part being disposed between the plurality of second conductive layers and the first semiconductor layer; and
    a first wiring electrically connected to the first semiconductor layer, wherein
    the semiconductor memory device is configured to be able to perform a read operation and a first operation performed before the read operation,
    in the read operation:
        a read voltage is supplied to an n-th (n is an integer of one or more) first conductive layer among the plurality of first conductive layers counted from one side in the first direction;
        a read pass voltage larger than the read voltage is supplied to at least a part of the plurality of first conductive layers; and
        a second voltage is supplied to an n-th second conductive layer among the plurality of second conductive layers counted from the one side in the first direction,
    in the first operation:
        a first voltage larger than the second voltage is supplied to the first wiring;
        the second voltage is supplied to the n-th second conductive layer; and
        a voltage smaller than the read pass voltage is supplied to at least a part of the plurality of first conductive layers, and
    a voltage of the n-th second conductive layer is maintained at the second voltage from a first timing during the first operation to a second timing at which a sense operation ends in the read operation.

2. The semiconductor memory device according to claim 1, wherein
    the second voltage is supplied to n−1-th to n+1-th second conductive layers counted from the one side in the first direction in the first operation.

3. The semiconductor memory device according to claim 2, wherein
    the second voltage is supplied to the n−1-th to n+1-th second conductive layers in the read operation.

4. The semiconductor memory device according to claim 3, wherein
    voltages of the n−1-th to n+1-th second conductive layers are maintained at the second voltage from the first timing to the second timing.

5. The semiconductor memory device according to claim 1, wherein
    the second voltage is supplied to at least a part of the plurality of second conductive layers closer to the first wiring than the n-th second conductive layer in the first operation.

6. The semiconductor memory device according to claim 1, comprising
    a second wiring electrically connected to the first semiconductor layer, wherein
    a third voltage larger than the second voltage is supplied to the second wiring in the first operation.

7. The semiconductor memory device according to claim 6, wherein
    the second voltage is supplied to at least a part of the plurality of second conductive layers closer to the second wiring than the n-th second conductive layer in the first operation.

8. The semiconductor memory device according to claim 1, comprising:
    a third conductive layer aligned with the plurality of first conductive layers in the first direction; and
    a fourth conductive layer spaced from the third conductive layer in the second direction, the fourth conductive layer being aligned with the plurality of second conductive layers in the first direction, wherein
    the first semiconductor layer is disposed between the third conductive layer and the fourth conductive layer, and the first semiconductor layer is opposed to the third conductive layer and the fourth conductive layer,
    in the read operation:
        a fourth voltage is supplied to the third conductive layer; and
        a fifth voltage smaller than the fourth voltage is supplied to the fourth conductive layer, and
    in the first operation,
        the second voltage is supplied to at least one of the third conductive layer or the fourth conductive layer.

9. The semiconductor memory device according to claim 1, comprising:
    a third conductive layer aligned with the plurality of first conductive layers in the first direction; and
    a fourth conductive layer spaced from the third conductive layer in the second direction, the fourth conductive layer being aligned with the plurality of second conductive layers in the first direction, wherein
    the first semiconductor layer is disposed between the third conductive layer and the fourth conductive layer, and the first semiconductor layer is opposed to the third conductive layer and the fourth conductive layer,
    in the read operation:
        a fourth voltage is supplied to the third conductive layer,
        a fifth voltage smaller than the fourth voltage is supplied to the fourth conductive layer, and
    in the first operation:
        the second voltage is supplied to the third conductive layer, and the fifth voltage is supplied to the fourth conductive layer.

10. The semiconductor memory device according to claim 1, wherein
voltages of an n−1-th first conductive layer and an n+1-th first conductive layer amonbg the plurality of first conductive layers counted from the one side in the first direction are maintained at the read pass voltage or a voltage larger than the read pass voltage from the first timing to the second timing at which.

11. The semiconductor memory device according to claim 10, wherein
a voltage of the n-th first conductive layer is maintained at the read pass voltage from the first timing to a third timing between the first timing and the second timing.

12. The semiconductor memory device according to claim 1, wherein
the read operation is a data read operation, and
the first operation and the read operation are performed in response to an input of a command set indicating performing the data read operation.

13. The semiconductor memory device according to claim 1, wherein
the read operation is a data read operation,
the first operation is performed in response to an input of a command set indicating performing the first operation, and
the read operation is performed in response to an input of a command set indicating performing the data read operation.

14. The semiconductor memory device according to claim wherein
the read operation is a verify operation included in a write operation, and
the first operation and the verify operation are performed in response to an input of a command set indicating performing the write operation.

15. The semiconductor memory device according to claim 1, wherein
the read operation is an erase verify operation included in an erase operation; and
the first operation and the erase verify operation are performed in response to an input of a command set indicating performing the erase operation.

16. The semiconductor memory device according to claim 1, wherein the read pass voltage is supplied to the n-th first conductive layer at a fourth timing between the first timing and the second timing.

17. The semiconductor memory device according to claim 1, wherein the read pass voltage is supplied to at least a part of the plurality of first conductive layers at a fourth timing between the first timing and the second timing.

* * * * *